(12) United States Patent
Suenaga et al.

(10) Patent No.: US 8,896,187 B2
(45) Date of Patent: Nov. 25, 2014

(54) PIEZOELECTRIC FILM AND METHOD FOR MANUFACTURING THE SAME, PIEZOELECTRIC FILM ELEMENT AND METHOD FOR MANUFACTURING THE SAME, AND PIEZOELECTRIC FILM DEVICE

(75) Inventors: Kazufumi Suenaga, Tsuchiura (JP); Kenji Shibata, Tsukuba (JP); Kazutoshi Watanabe, Tsuchiura (JP); Akira Nomoto, Kasumigaura (JP); Fumimasa Horikiri, Nagareyama (JP)

(73) Assignee: Hitachi Metals, Ltd., Tokyo (JP)

( * ) Notice: Subject to any disclaimer, the term of this patent is extended or adjusted under 35 U.S.C. 154(b) by 297 days.

(21) Appl. No.: 13/532,081

(22) Filed: Jun. 25, 2012

(65) Prior Publication Data
US 2013/0015392 A1  Jan. 17, 2013

(30) Foreign Application Priority Data

Jul. 15, 2011 (JP) .................. 2011-156212

(51) Int. Cl.
*H01L 41/083* (2006.01)
*H01L 41/08* (2006.01)
*H01L 41/187* (2006.01)
*H01L 41/316* (2013.01)

(52) U.S. Cl.
CPC ........ *H01L 41/0805* (2013.01); *H01L 41/1873* (2013.01); *H01L 41/316* (2013.01)
USPC ................ 310/358; 252/62.9 PZ; 252/62.9 R

(58) Field of Classification Search
USPC .......... 310/311, 358, 328, 365–367; 501/134; 252/62.9 R, 62.9 PZ
See application file for complete search history.

(56) References Cited

U.S. PATENT DOCUMENTS

| | | | | |
|---|---|---|---|---|
| 6,347,862 | B1 | 2/2002 | Kanno et al. | |
| 7,902,730 | B2 * | 3/2011 | Shibata et al. | 310/358 |
| 8,310,135 | B2 * | 11/2012 | Suenaga et al. | 310/358 |
| 8,310,136 | B2 * | 11/2012 | Suenaga et al. | 310/358 |
| 2008/0308762 | A1 * | 12/2008 | Ueno et al. | 252/62.9 R |

FOREIGN PATENT DOCUMENTS

| | | |
|---|---|---|
| JP | 10-286953 A | 10/1998 |
| JP | 2005-333088 A | 2/2005 |
| JP | 2007-019302 A | 1/2007 |

\* cited by examiner

*Primary Examiner* — Thomas Dougherty
*Assistant Examiner* — Karen B Addison
(74) *Attorney, Agent, or Firm* — Martin Fleit; Paul D. Bianco; Fleit Gibbons Gutman Bongini & Bianco PL

(57) ABSTRACT

There is provided a piezoelectric film having an alkali niobate-based perovskite structure expressed by a general formula $(Na_xK_yLi_z)NbO_3$ ($0 \le x \le 1$, $0 \le y \le 1$, $0 \le z \le 0.2$, $x+y+z=1$), wherein the alkali niobate has a crystal structure of a pseudo-cubic crystal, a tetragonal crystal, an orthorhombic crystal, a monoclinic crystal, a rhombohedral crystal, or has a crystal structure of coexistence of them, and when total of K—O bonding and K-Metal bonding is set as 100% in a binding state around K-atom of the alkali niobate, a K—O bonding ratio is 46.5% or more and a K-Metal bonding ratio is 53.5% or less, wherein the Metal indicates a metal atom included in the piezoelectric film.

12 Claims, 12 Drawing Sheets

PIEZOELECTRIC FILM AND METHOD FOR MANUFACTURING THE SAME, PIEZOELECTRIC FILM ELEMENT AND METHOD FOR MANUFACTURING THE SAME, AND PIEZOELECTRIC FILM DEVICE

The present application is based on Japanese Patent Application No. 2011-156212, filed on Jul. 15, 2011, the entire contents of which are hereby incorporated by reference.

BACKGROUND OF THE INVENTION

1. Technical Field

The present invention relates to a piezoelectric film with little oxygen defect and having excellent piezoelectric characteristics and a method for manufacturing the same, a piezoelectric film element and a method for manufacturing the same, and a piezoelectric film device.

2. Description of the Related Art

The piezoelectric film is processed into various piezoelectric film elements for different kinds of purposes, and is widely utilized as functional electronic components such as particularly an actuator that causes deformation to occur by applied voltage, and a sensor that generates a voltage from the deformation of the element reversely. A lead-based dielectric having excellent piezoelectric characteristics and particularly $Pb(Zr_{1-x}Ti_x)O_3$-based perovskite ferroelectric called PZT is widely used as a piezoelectric utilized for the usage as the actuator and the sensor. Such a perovskite ferroelectric is usually formed by sintering an oxide composed of individual elements.

Further, in recent years, a development of a piezoelectric not containing lead is desired in consideration of an environment, and a development of lithium potassium sodium niobate (general formula: $(Na_xK_yLi_z)NbO_3 (0<x<1, 0<y<1, 0<z<1, x+y+z=1)$, etc., is progressed. The lithium potassium sodium niobate has the piezoelectric characteristics corresponding to PZT, and therefore is expected as a strong candidate of a lead-free piezoelectric material.

Meanwhile, as miniaturization and higher performance of each kind of electronic component are achieved, miniaturization and higher performance of the piezoelectric element are also strongly desired. However, in a piezoelectric material fabricated by a manufacturing method focusing on a sintering method, which is a conventional method, when a thickness of the material becomes particularly 10 μm or less, a size of the material is close to a size of a crystal grain that constitutes the material, and an influence of the size can't be ignored, thus involving a problem that variation of the characteristics or deterioration becomes remarkable. In order to prevent such a problem, a method for forming a piezoelectric utilizing a thin film technique instead of the sintering method, has been studied in recent years.

In recent years, a PZT thin film formed on a silicon substrate by a RF sputtering method, is put to practical use as an actuator for a head of a fast high-resolution inkjet printer (for example, see patent document 1).

Further, a piezoelectric film with a part of Pb replaced by Bi (bismuth) is put to practical use as a small and inexpensive gyro sensor or angular velocity sensor (for example see patent document 2). According to the patent document 2, for example, the piezoelectric film formed by the sputtering method is capable of obtaining a high piezoelectric constant by replacing part of Pb by Bi, even in a case of a composition having excess or deficiency of oxygen.

Further, patent document 3 proposes a piezoelectric film having high orientation in a specific plane direction, wherein a piezoelectric thin film element of lithium potassium sodium niobate not using lead is expressed by a general formula $(Na_xK_yLi_z)NbO_3$. According to the patent document 3, for example, the piezoelectric thin film formed by the sputtering method is lead-free, having excellent piezoelectric characteristics.

Patent document 1:
Japanese Patent Laid Open Publication No. 1998-286953
Patent document 2:
Japanese Patent Laid Open Publication No. 2005-333088
Patent document 3:
Japanese Patent Laid Open Publication No. 2007-19302

Incidentally, the sputtering method is frequently used, which is a proven technique as a mass production in forming the piezoelectric film. As shown in FIG. 11, the sputtering method is a method for forming a thin film 24 by plasma-ionizing argon gas as a kind of an inert gas in a vacuum environment of a sputtering device 20, then colliding the argon ion against a target 21, being a sintered body constituted of the same element composition as the composition of the piezoelectric film, so that sputtering particles 22 that fly out from the target 21 by collision of the argon ion, are adhered to a substrate 23 which is opposed to the target 21.

In this sputtering method, film formation is carried out under a high vacuum state in principle, and therefore oxygen is insufficient in the formed piezoelectric film in many cases. Namely, in the piezoelectric film formed by the sputtering method, oxygen is stoichiometrically reduced compared with a raw material target, thus generating a compositional deviation of the oxygen.

Further, when the piezoelectric film device is fabricated, there is a case that the piezoelectric film is subjected to heat treatment in a reduction atmosphere, or a case that a molecule constituted of water, etc., having hydrogen and a hydroxyl group is used as a raw material when an insulating layer and a protective layer are formed in a peripheral part of the piezoelectric film. In this cases, the piezoelectric film allows a reductive reaction to be promoted by reaction between hydrogen, being an atmosphere gas, and oxygen in the piezoelectric film, on an interface between the piezoelectric film and an electrode made of Pt having catalytic activity. As a result, the oxygen in the piezoelectric film is desorbed, thus generating the compositional deviation of the oxygen.

The compositional deviation of oxygen is caused by an oxygen defect generated in a local structure around each atom constituting the piezoelectric film. The oxygen defect is a lattice defect generated by fluctuation of a bonding state of an atomic level in the piezoelectric film, which is caused by the reductive reaction. The piezoelectric film having the oxygen defect has a low piezoelectric characteristic, because it is difficult to form a perovskite structure.

From this point, it can be considered that in a case of the PZT-based piezoelectric film of the patent document 2, high piezoelectric characteristic can be obtained even if having excess/deficiency of oxygen (compositional deviation of oxygen), but the PZT-based piezoelectric film includes lead, and it is difficult to improve the piezoelectric characteristics by suppressing the oxygen defect. Further, in a case of the piezoelectric film of the patent document 3, it is also difficult to improve the piezoelectric characteristics by suppressing the oxygen defect, although the piezoelectric film does not include lead.

BRIEF SUMMARY OF THE INVENTION

An object of the present invention is to provide a piezoelectric film with little oxygen defect and having excellent piezoelectric characteristics and a method for manufacturing the same, a piezoelectric film element and a method for manufacturing the same, and a piezoelectric film device.

A first aspect of the present invention provides a piezoelectric film having an alkali niobate-based perovskite structure expressed by a general formula $(Na_xK_yLi_z)NbO_3$ ($0 \leq x \leq 1$, $0 \leq y \leq 1$, $0 \leq z \leq 0.2$, $x+y+z=1$), wherein the alkali niobate has a crystal structure of a pseudo-cubic crystal, a tetragonal crystal, an orthorhombic crystal, a monoclinic crystal, a rhombohedral crystal, or has a crystal structure of coexistence of them, and when total of K—O bonding and K-Metal bonding is set as 100% in a binding state around K-atom of the alkali niobate, a K—O bonding ratio is 46.5% or more and a K-Metal bonding ratio is 53.5% or less, wherein the Metal indicates a metal atom included in the piezoelectric film.

DETAILED DESCRIPTION OF THE INVENTION

Figure 1A:
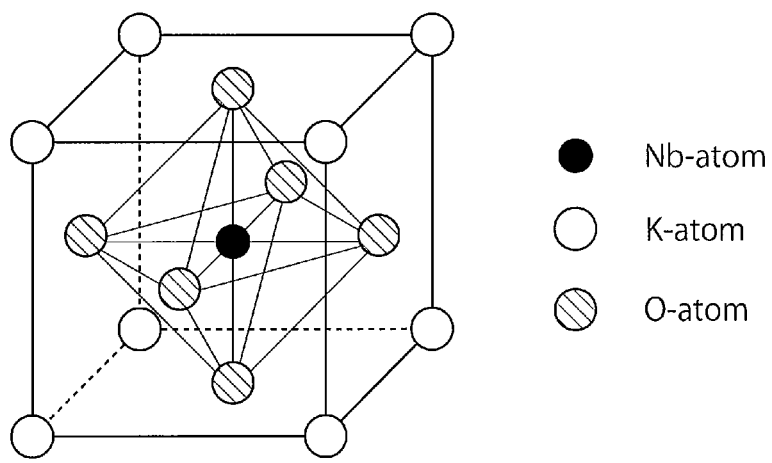
FIG. 1A is a view showing a crystal lattice with Nb-atom of alkali niobate as a center.

A conventional piezoelectric film, for example the piezoelectric film having an alkali niobate-based perovskite structure expressed by a general formula $(Na_xK_yLi_z)NbO_3$ ($0 \leq x \leq 1$, $0 \leq y \leq 1$, $0 \leq z \leq 0.2$, $x+y+z=1$), is formed by setting a composition or a crystal structure thereof in a prescribed setting. The composition of the piezoelectric film is qualitatively evaluated by a generally known electron probe micro analyzer (called EPMA hereafter). According to EPMA, A-site atoms (such as potassium and sodium), and B-site atoms (such as niobium), being constituent atoms of the piezoelectric film, are qualitatively evaluated, and elements contained therein and a content of the elements are measured. Further, a crystal structure of the piezoelectric film is measured by an X-ray diffraction method, being a general method of a structural analysis. According to the X-ray diffraction method, a structure with long range order in the piezoelectric film is evaluated.

However, conventionally it is difficult to form the piezoelectric film having desired piezoelectric characteristics with good reproducibility, irrespective of a prescribed setting of the composition or the crystal structure.

This is because a detection lower limit is low in the EPMA method, and the oxygen defect gene rated in the local structure of an atomic level (binding state of the atomic level) is not quantitatively evaluated. Further, this is because the structure with short range order and the binding state around a specific atom in a narrow region of an atom diameter level, is not measured in the X-ray diffraction method, and the oxygen defect is not sufficiently evaluated. Namely, in a conventional piezoelectric film, only the crystal structure is evaluated based on the composition of the constituent atom or a structure with long range order which is larger than the atomic level structure, and the binding state of the atomic level is not strictly measured and the oxygen defect is not quantitatively evaluated.

It is unclear heretofore how the binding state of the atomic level in the piezoelectric film is fluctuated to have the oxygen defect, depending on a film forming condition such as a film forming charged power, film forming temperature, or a distance between a substrate and a raw material target and a heat treatment condition after film formation. Thus, conventionally the piezoelectric film is formed based on a qualitative evaluation without quantifying the oxygen defect, thus making it difficult to form the piezoelectric film having excellent piezoelectric characteristics with good reproducibility.

Therefore, inventors of the present invention quantitatively analyze the binding state of the atomic level and a ratio of a valence number of each atom of the Nb-atom, A-site atom or O-site atom, being constituent atoms of the piezoelectric film, and quantitatively evaluate the oxygen defect of the piezoelectric film, and examine an influence of the oxygen defect added on the piezoelectric characteristics.

As a result, it is found that the binding state of the atomic level around each atom constituting the piezoelectric film is fluctuated by the oxygen defect.

Specifically, as shown in FIG. 1A, in an oxide having the perovskite structure without oxygen defect, six oxygen ions are coordinated onto cation of the Nb-atom. In such a perovskite structure, Nb-atom is formed as $Nb^{5+}$ having valence number of 5, in which $NbO_3^-$ bonding is formed by stoichiometrically bonding O-atom of 3 to the Nb-atom of 1.

Meanwhile, when the oxide has the oxygen defect due to oxygen inefficiency or reduction during film formation, Nb-atom becomes $Nb^{2+}$ having valence number of resulting from reducting $Nb^{5+}$, to thereby form NbO bonding. Namely, one O-atom is bonded to one Nb-atom, and the number of O-atoms bonding to Nb-atom is stoichiometrically reduced compared with an original perovskite structure. Such a reduction of the number of O-atoms is the oxygen defect, thus causing the compositional deviation of oxygen over an entire body of the piezoelectric film. Great deterioration of the piezoelectric characteristics is caused by the oxygen defect, even in a ratio not allowing a large compositional deviation to occur. Namely, in the piezoelectric film, the binding state of the atomic level is fluctuated by including the oxygen defect, resulting in deterioration of the piezoelectric characteristics.

As described above, it is found by the inventors of the present invention that the piezoelectric characteristics can be improved by adjusting the binding state of the atomic level of each atom constituting the piezoelectric film and the ratio of the valence number of atoms, and controlling the oxygen defect. The present invention is thus achieved.

Figure 2A:
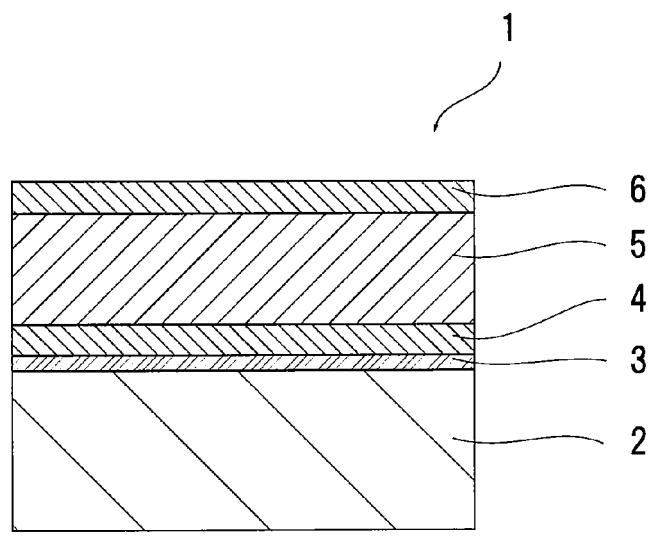
FIG. 2A is a cross-sectional view showing a structure of a piezoelectric film element according to an embodiment of the present invention.

Embodiments of the piezoelectric film element having the piezoelectric film of the present invention will be described hereafter. FIG. 2A is a cross-sectional view showing a structure of the piezoelectric film element according to an embodiment of the present invention.

(Structure of the Piezoelectric Film Element)

As shown in FIG. 2A, a piezoelectric film element 1 of this embodiment has a substrate 2; an adhesion layer 3 formed on a surface of the substrate 2; a lower electrode layer 4 formed on the adhesion layer 3; a piezoelectric film 5 formed on the lower electrode layer 4; and an upper electrode layer 6 formed on the piezoelectric film 5, wherein the piezoelectric film 5 is composed of perovskite alkali niobate expressed by a general formula $(Na_xK_yLi_z)NbO_3 (0 \le x \le 1, 0 \le y \le 1, 0 \le z \le 0.2, x+y+z=1)$.

(Substrate)

The substrate 2 includes Si substrates, MgO substrates, ZnO substrates, $SrTiO_3$ substrates, $SrRuO_3$ substrates, glass substrates, quartz glass substrates, GaAs substrates, GaN substrates, sapphire substrates, Ge substrates, and stainless substrates, etc. Among them, an inexpensive and industrially proven Si substrate is particularly preferable. However, when the Si substrate is used, an oxide film is preferably formed on a surface of the Si substrate. The oxide film formed on the surface of the substrate 2 includes thermal oxide films formed by thermal oxidation, and Si oxide films formed by CVD (Chemical Vapor Deposition). Note that a lower electrode layer such as a Pt electrode may be directly formed on an oxide substrate such as quartz glass, and MgO, $SrTiO_3$, $SrRuO_3$ substrates, without forming the oxide film.

(A Lower Electrode Layer)

The lower electrode layer 4 is formed on the substrate 2 through the adhesion layer 3. The lower electrode layer 4 is an important layer for forming the piezoelectric film 5, and is formed by sputtering and vapor deposition for example. Preferably, the lower electrode layer 4 is preferentially oriented in (111) plane direction. The lower electrode layer 4 preferentially oriented in (111) plane direction (direction vertical to the surface of the substrate 2) is a polycrystalline layer having a columnar structure, wherein the piezoelectric film 5 formed on the lower electrode layer 4 can be preferentially oriented in a specific plane direction.

The lower electrode layer 4 is preferably a single electrode layer made of Pt or an alloy mainly composed of Pt, or an electrode layer of a lamination structure including the electrode layer mainly composed of Pt. This is because when the piezoelectric film 5 is heated and oxidized, oxidation is promoted by Pt having catalytic activity, and the piezoelectric film 5 can be efficiently oxidized. Otherwise, the lower electrode layer 4 is preferably a single electrode layer made of Pd or an alloy mainly composed of Pd, or an electrode layer of a lamination structure including the electrode layer mainly composed of Pd. This is because oxidation is promoted by Pd having catalytic activity similarly to Pt, in an atmosphere including $N_2O$ or $O_2$, and the piezoelectric characteristics can be efficiently improved in a heating process. Otherwise, Ru, Ir, Sn, In, or an oxide of them can also be used for the lower electrode layer 4. Particularly, Ru and Ir can be used for the oxide electrode, so that reduction of the piezoelectric characteristics due to oxygen defect caused by a reductive reaction of the piezoelectric film in a reducing atmosphere, can be suppressed as much as possible.

(An Upper Electrode Layer)

The upper electrode layer 6 is an electrode formed on the piezoelectric film 5, and does not give a large influence on the crystal structure of the piezoelectric film 5 like the lower electrode layer 4, and therefore the crystal structure of the upper electrode layer 6 is not particularly limited. However, preferably the upper electrode layer 6 is made of a material similar to the material of the lower electrode layer 4. Namely, the upper electrode layer 6 is preferably a single electrode layer made of Pt or an alloy mainly composed of Pt, or an electrode layer of a lamination structure including the electrode layer mainly composed of Pt, and is preferably a single electrode layer made of Pd or an alloy mainly composed of Pd, or an electrode layer of a lamination structure including the electrode layer mainly composed of Pd.

(Structure of the Piezoelectric Film)

The piezoelectric film 5 according to this embodiment has an alkali niobate-based perovskite structure expressed by a general formula $(Na_xK_yLi_z)NbO_3 (0 \le x \le 1, 0 \le y \le 1, 0 \le z \le 0.2, x+y+z=1)$, wherein the alkali niobate has a crystal structure of a pseudo-cubic crystal, a tetragonal crystal, an orthorhombic crystal, a monoclinic crystal, a rhombohedral crystal, or has a crystal structure of coexistence of them, and when total of K—O bonding and K-Metal bonding is set as 100% in a binding state around K-atom of the alkali niobate, a K—O bonding ratio is 46.5% or more and a K-Metal bonding ratio is 53.5% or less. Wherein the Metal indicates a metal atom included in the piezoelectric film.

Figure 1B:
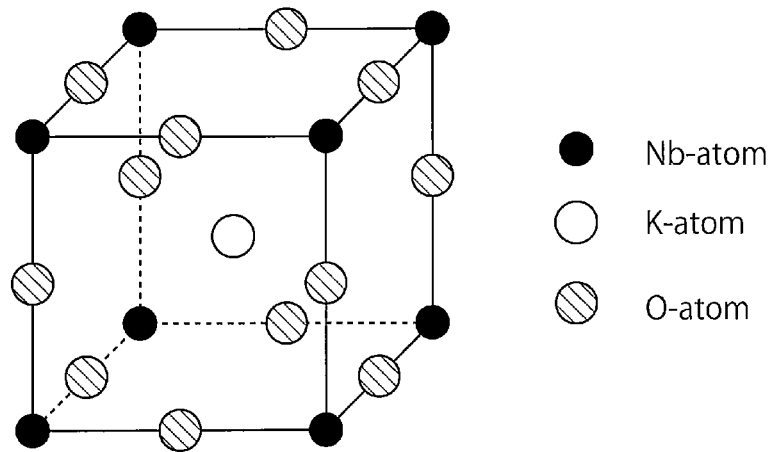
FIG. 1B is a view showing a crystal lattice with K-atom of alkali niobate as a center.
Figure 1C:
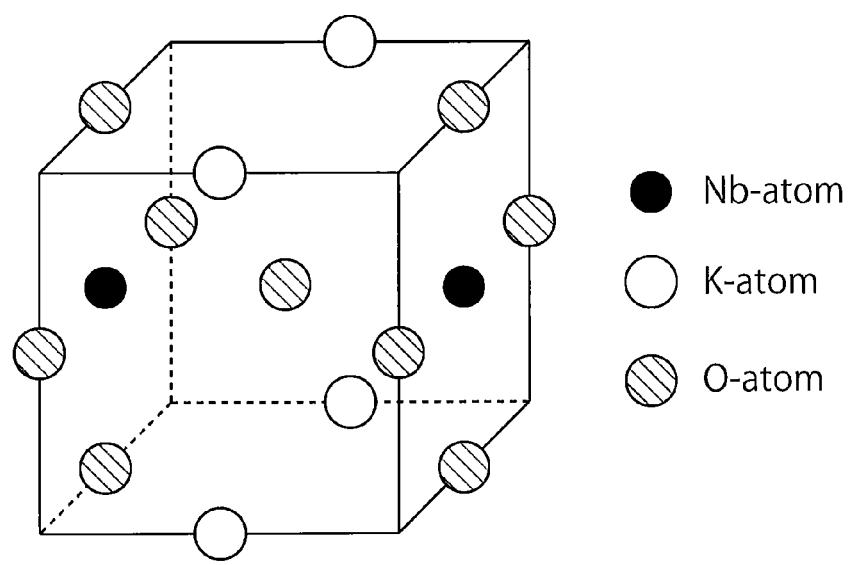
FIG. 1C is a view showing a crystal lattice with O-atom of alkali niobate as a center.

The crystal structure of the piezoelectric film 5 according to this embodiment, has the perovskite structure as shown in FIG. 1A, FIG. 1B, or FIG. 1C. FIG. 1A is a view showing a crystal lattice with Nb-atom of alkali niobate as a center; FIG. 1B is a view showing a crystal lattice with K-atom, being A-site atom as a center; and FIG. 1C is a view showing a crystal lattice of FIG. 1A and FIG. 1B, with O-atom as a center. Although in FIG. 1A, FIG. 1B, and FIG. 1C, the crystal structure is shown as a cubic crystal, actually the crystal structure is shown as a pseudo-cubic crystal and a tetragonal crystal.

As shown in FIG. 1B, O-atoms are coordinated around the K-atom nearest to each other, thus forming first nearest neighboring atoms. 12 O-atoms, being the first nearest neighboring atoms, are coordinated onto the K-atom with a prescribed space between atoms, to thereby form K—O bonding. Further, Nb-atoms are coordinated around the K-atom subsequently to the O-atoms, to thereby form second nearest neighboring atoms. 8 Nb-atoms, being the second nearest atoms, are coordinated around the K-atom with a prescribed space between atoms, to thereby form K—Nb bonding. The bonding state around the K-atom indicates the binding state between the K-atom and the first nearest neighboring atoms (O-atoms) nearest to the K-atom, and indicates the binding state between the K-atom and the second nearest neighboring atoms nearest to the K-atom. As shown in FIG. 1A, the binding state around the Nb-atom indicates the binding state between the Nb-atom, and the first nearest neighboring atoms and the second nearest neighboring atoms, similarly to the binding state around K-atom. As shown in FIG. 1C, the binding state around O-atom is also similar to the binding state around K-atom or Nb-atom. Note that since the crystal structure is not the cubic crystal, an interatomic distance between the K-atom of the center of the crystal lattice and a plurality of O-atoms coordinated around the K-atom is slightly different. Then, the binding state and binding energy are different due to such a difference in interatomic distance, even in a case of the same K—O bonding. Similarly, the interatomic distance between the K-atom and a plurality of Nb-atoms is slightly different, and the binding state and the binding energy are also different.

Here, explanation is given for a calculation of the K—O bonding ratio.

In this embodiment, the K—O bonding ratio is measured by an X-ray Photoelectron Spectroscopy (called XPS hereafter), wherein the K—O bonding ratio is calculated as the ratio of intensity I (K—O), with respect to total of intensity I of K—O bonding (K—O) and intensity I of K-Metal bonding (K-Metal).

In the XPS method, a surface of a sample (piezoelectric film) is irradiated with X-ray, so that constituent atoms as measuring objects are excited, and energy of photoelectrons generated from the excited atoms are measured, to thereby analyze the constituent atoms and the binding state (electron state) thereof. According to the XPS method, the binding state (electron state of the constituent atoms) of the constituent atoms of the piezoelectric film is specified by binding energy thereof. Specifically, the binding state (electron state) of the atomic level is different between the K-atom of K—O bonding and K-atom of K—Nb bonding, and therefore different binding energy is detected. Namely, according to the XPS method, electron states of K-atom, O-atom, and Nb-atom that constitute K—O bonding and K—Nb bonding are specified. In addition to specifying the electron states of the constituent atoms, how much such atoms are included (the number of bonding) is measured as intensity, from the number of photoelectrons generated from the atoms in a prescribed electron state.

Figure 5A:
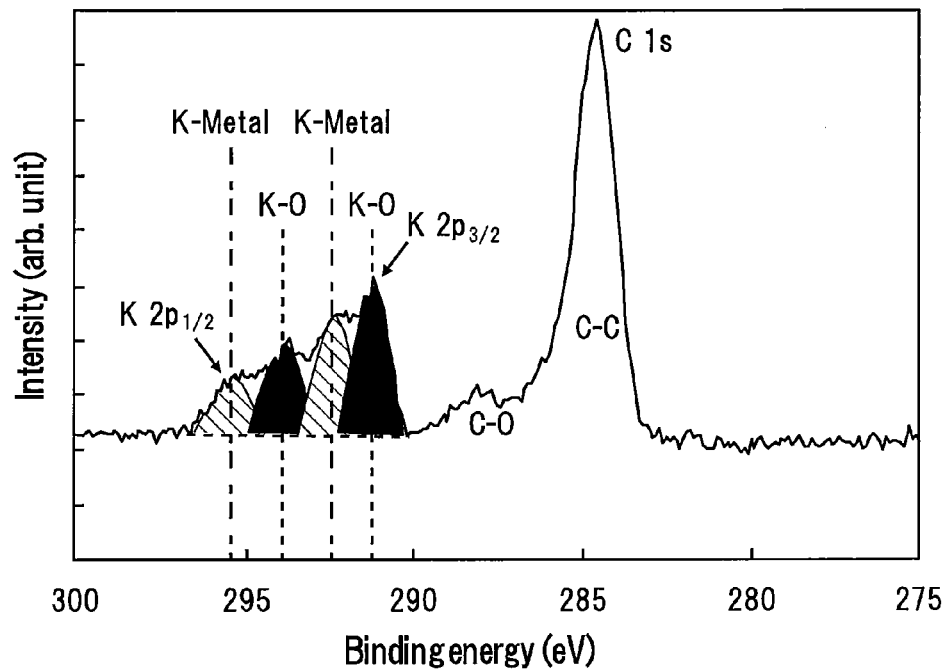
FIG. 5A is a view showing a spectrum of K2p obtained by measuring the piezoelectric film of example 1 by X-ray photoelectron spectroscopic analysis.

However, in the oxide having the perovskite structure, a peak showing the atoms constituting K—O bonding is detected in a state of being dispersed in a wider range than a range of prescribed binding energy (see FIG. 5A showing the spectrum of example 1 as will be described later). Therefore, the intensity of K—O bonding is calculated as integrated intensity, being an integrated value (peak area) of the intensity detected in a state of being dispersed in a prescribed energy range. A reason why K—O bonding is detected in a state of being dispersed in a wider range than the range of the prescribed binding energy is that the interatomic distance is different even in a case of the same K—O bonding, thus slightly differentiating each binding energy. Similarly to K—O bonding, K-Metal bonding is also expressed as the integrated intensity.

"Metal" in K-Metal bonding indicates Nb-atom, Na-atom, K-atom, and Li-atom of metal atoms included in the piezoelectric film, and K-Metal bonding includes K—Nb bonding, K—Na bonding, K—K bonding, and K—Li bonding. This is because according to the XPS method, it is not easy to measure the bonding state of K—Na bonding, K—K bonding, K—Li bonding by separating them from K—Nb bonding, and there is a possibility that such bonding states are measured in a state that certain number of them coexists with K—Nb bonding. Namely, K-Metal bonding includes mainly K—Nb bonding, and includes certain number of K—Na bonding, etc., at a lower ratio than the K—Nb bonding ratio. Accordingly, K-Metal bonding indicates at least K—Nb bonding, and K-Metal bonding can be formed as K—Nb bonding when only K—Nb bonding can be separated and measured.

Thus, the K—O bonding ratio is calculated as the ratio of I(K—O) to the total of integrated intensity I(K—O) of K—O bonding and integrated intensity I(K-Metal) of K-Metal bonding.

Subsequently, explanation is given for a technical meaning of the piezoelectric film specified by the K—O bonding ratio.

As described above, in the piezoelectric film, O-atoms are likely to be reduced stoichiometrically by the oxygen defect (deficit). Meanwhile, defect (deficit) of K-atom and Nb-atom is hardly generated, compared with the defect of O-atom, and prescribed quantities of K-atoms and Nb-atoms are included in the piezoelectric film. Namely, when the local structure around the K-atom is focused, K-Metal bonding is relatively stably formed, compared with K—O bonding in which the number of bonding is fluctuated due to the oxygen defect (deficit). Therefore, approximately a constant number of K-Metal bonding is ensured. Accordingly, the fluctuation (increase/decrease) of the number of K—O bonding is known from the K-Metal bonding ratio and the K—O bonding ratio, with respect to the constant number of K-Metal bonding, and the excess/deficiency of O-atoms around a specific atom such as K-atom in the piezoelectric film is known. Namely, reduction of the O-atoms is known, which is caused by the oxygen defect (deficit) in the local structure. Accordingly, in this embodiment, the local structure of the atomic level in the piezoelectric film can be optimized and the piezoelectric film with less oxygen defect (deficit) can be obtained, by adjusting the number of O-atoms in the piezoelectric film by defining the K—O bonding ratio.

To summarize, in the piezoelectric film element according to this embodiment, the K—O bonding ratio in the piezoelectric film is 46.5% or more, which is calculated from the integrated intensity measured by XPS. Further, the K-Metal bonding ratio is 53.5% or less. With this structure, the piezoelectric film includes K—O bonding containing O-atoms, and K-Metal bonding containing Nb-atoms, etc., at a prescribed ratio in the local structure of the atomic level. Namely, the piezoelectric film has the perovskite structure in which O-atoms and Nb-atoms are coordinated around K-atom at a prescribed ratio, in a minimum unit such as a bonding state of the atomic level. Therefore, the piezoelectric film has a structure with less oxygen defect (deficit) in the local structure of the atomic level. Then, the piezoelectric film has excellent piezoelectric characteristic, because instability of an atomic level structure caused by the oxygen defect (deficit) is suppressed.

Meanwhile, according to a conventional piezoelectric film, the crystal structure is specified based on a composition ratio or a structure with long range order which is larger than an atomic level structure. Accordingly, a local atomic level structure has not been specified heretofore, and therefore arrangement of oxygen around a specific atom is not controlled even when the composition ratio of oxygen is not deviated and an optimal value can be obtained.

Therefore, according to the piezoelectric film of this embodiment, the local structure (binding state) of the atomic level around K-atom, Nb-atom, and O-atom can be adjusted. Therefore, the piezoelectric film can have a stable structure in an entire body of the film and can have a crystal structure with less oxygen defect, in which O-atoms are arranged in a specified atomic site. Thus, the piezoelectric film having excellent piezoelectric characteristics can be obtained.

Further, alkali niobate of the piezoelectric film is preferably included in the piezoelectric film element of this embodiment, so that the K—O bonding ratio is 46.5% or more and 75% or less, and the K-Metal bonding ratio is 25% or more and 53.5% or less. The K—O bonding ratio is further preferably 47% or more and 60% or less, and the K-Metal bonding ratio is further preferably 40% or more and 53% or less. The reason why the K—O bonding ratio is set in the aforementioned range, is that oxygen in the piezoelectric film is insufficient when the ratio is smaller than 46.5%, and oxygen in the piezoelectric film is excessive when the ratio is 75% or more, thus partially forming a phase having a structure other than the perovskite structure, and excellent piezoelectric characteristics can not be obtained as a whole.

Further, in the binding state of the alkali niobate of the piezoelectric film around Nb-atom in the piezoelectric film element of this embodiment, when total of $Nb^{5+}$ for $NbO_3^-$ bonding, and $Nb^{2+}$ for NbO bonding resulting from reducting $NbO_3^-$, is set as 100%, preferably the ratio of $Nb^{5+}$ is 98.2% or more and 100% or less, and the ratio of $Nb^{2+}$ is 0% or more and 1.8% or less. Further preferably, the ratio of $Nb^{5+}$ is 99% or more and 100% or less, and the ratio of $Nb^{2+}$ is 0% or more and 1% or less. This is because when the ratio of $Nb^{5+}$ is smaller than 98.2%, reduced $Nb^{2+}$ is increased and the oxygen defect is also increased, thus deteriorating the piezoelectric characteristics. With this structure, the piezoelectric characteristics can be further improved by controlling $Nb^{2+}$ that shows the oxygen defect.

Further, in the binding state of the alkali niobate around O-atom in the piezoelectric film element of this embodiment, when total of $Nb^{5+}$ for $NbO_3^-$ bonding, $Nb^{2+}$ for NbO bonding resulting from reducting $NbO_3^-$, $K^+$ for $K_2O$ bonding, and $Na^+$ for $Na_2O$ bonding, is set as 100%, preferably the ratio of $Nb^{5+}$ is 61.4% or more and 100% or less, and total of the ratios of $Nb^{2+}$, K+, and Na+ is 0% or more and 38.6% or less. Further preferably, the ratio of $Nb^{5+}$ is 62% or more and 100% or less, and total of the ratios of $Nb^{2+}$, K+, and Na+ is 0% or more and 38% or less. This is because when the ratio of $Nb^{5+}$ is outside of the aforementioned range, excess/deficiency of oxygen in the piezoelectric film is generated, thus making it difficult that the alkali niobate has the perovskite structure.

Further, in the piezoelectric film element of this embodiment, any one of a crystal layer, an amorphous layer, or a mixed layer of the crystal layer and the amorphous layer of the perovskite oxide expressed by a general formula $ABO_3$ is further included in a part of the alkali niobic oxide of the piezoelectric film, and when total of A-O bonding and A-Metal bonding in the binding state around A-atom of $ABO_3$, is set as 100%, preferably the A-O bonding ratio is 46.5% or more, and the A-Metal bonding ratio is 53.5% or less. Wherein, A is an element of one kind or more selected from Li, Na, K, Pb, La, Sr, Nd, Ba, Bi, and B is an element of one kind or more selected from Zr, Ti, Mn, Mg, Nb, Sn, Sb, Ta, In, and O is oxygen.

Further, when total of $B^{5+}$ for $BO_3^-$ bonding and $B^{2+}$ for BO bonding resulting from reducting $BO_3^-$ is set as 100% in the bonding state around B-atom of $ABO_3$, preferably the ratio of $B^{5+}$ is 98.2% or more and the ratio of $B^{2+}$ is 1.8% or less.

Further, when total of $B^{5+}$ for $BO_3^-$ bonding, $B^{2+}$ for BO bonding resulting from reducting $BO_3^-$, and $A^+$ for $A_2O$ bonding is set as 100% in the bonding state around O-atom of $ABO_3$, preferably the ratio of $B^{5+}$ is 61.4% or more and 100% or less, and the ratios of $B^{2+}$ and $A^+$ are 0% or more and 38.6% or less.

Further, preferably the piezoelectric film element of this embodiment has an oxide thin film for coating the piezoelectric film. The oxide thin film is capable of protecting the piezoelectric film from hydrogen and water, supplying oxygen to the piezoelectric film, and suppressing a reduction in the vicinity of the interface between a body of the piezoelectric film and the lower electrode layer. The oxide thin film may be made of the same material as the material of the piezoelectric film, or may be a thin film of a single layer or a laminated layer composed of $SiO_x(0<x\leq2)$ or $AlO_x$ ($0<x\leq1.5$). For example, a $SiO_2$ film and an $Al_2O_3$ film, etc., can be used as the oxide thin film.

Note that in the aforementioned embodiment, although the K—O bonding ratio is calculated from the integrated intensity measured by the XPS method, the present invention is not limited thereto. A method capable of specifying the binding state of the atomic level is acceptable as a calculation method of the K—O bonding ratio, and for example X-ray absorption fine structure analysis (called XAFS hereafter), is given as the method. XAFS has an oscillatory structure that appears on a high energy side of an X-ray absorption spectrum. The oscillatory structure is formed by an interference effect of an outgoing wave of photoelectrons emitted from absorbed atoms of X-ray, and an incident wave of electrons back-scattered by the atoms that exist around the absorbed atoms. Measured amplitude is proportional to the number of atoms, namely, the coordination number of the atoms that exist around the absorbed atoms. Accordingly, by analyzing the XAFS spectrum of K-atom while using a standard substance in which the coordinate number and the interatomic distance is clearly known, which element or how much coordination of the elements is arranged around K-atom can be evaluated. Then, by analysis using a radial distribution function obtained by Fourier transform of the XAFS spectrum, and a XAFS spectrum simulation based on a generally performed photoelectron multiple scattering theory using FEFF, the coordination number of O-atoms around K-atom, and the coordination number of Nb-atoms around K-atom can be obtained as numerical values. Such coordination numbers correspond to K—O bonding number and K—Nb bonding number, and therefore as a result, K—O bonding ratio and K—Nb bonding ratio can be calculated.

(A Method for Manufacturing the Piezoelectric Film Element)

Next, a method for manufacturing the piezoelectric film element according to this embodiment will be described, using FIG. 2A and FIG. 2B. The method for manufacturing the piezoelectric film element having the piezoelectric film according to this embodiment will be described hereafter.

The method for manufacturing the piezoelectric film element according to this embodiment comprises:

forming a lower electrode layer 4 on a substrate 2 through an adhesion layer 3;

forming a piezoelectric film 5 having an alkali niobate-based perovskite structure expressed by a general formula $(Na_xK_yLi_z)NbO_3(0\leq x\leq1,\ 0\leq y\leq1,\ 0\leq z\leq0.2,\ x+y+z=1)$, wherein the alkali niobate has a crystal structure of a pseudo-cubic crystal, a tetragonal crystal, an orthorhombic crystal, a monoclinic crystal, a rhombohedral crystal, or has a crystal structure of coexistence of them;

forming an upper electrode layer 6 on the piezoelectric film 5;

forming an oxide thin film 7 so as to coat the piezoelectric film 5; and heating and oxidizing the piezoelectric film at 600° C. or more.

First, the lower electrode layer 4 preferentially oriented in (111) plane direction is formed on the substrate 2 through the adhesion layer 3. The lower electrode layer 4 is preferably a single electrode layer made of Pt or an alloy mainly composed of Pt, or an electrode layer of a lamination structure including the electrode layer mainly composed of Pt. Otherwise, the lower electrode layer 4 is preferably a single electrode layer made of Pd or an alloy mainly composed of Pd, or an electrode layer of a lamination structure including the electrode layer mainly composed of Pd. With this structure, the reduction of the piezoelectric film can be suppressed and the compositional deviation of oxygen can be suppressed.

Next, the piezoelectric film 5 is formed by magnetron sputtering using a target having a prescribed composition ratio. The piezoelectric film 5 is formed while succeeding the orientation of the lower electrode layer 4, thereby forming the crystal structure preferentially oriented in (001) plane direction. The piezoelectric film 5 formed at this time includes the oxygen defect, thus generating the compositional deviation of oxygen. As a method for forming the piezoelectric film 5, a sol-gel method, a hydrothermal synthesis method, anion beam sputtering technique, CVD, or AD (Aerosol Deposition), etc., can be used in addition to a sputtering method.

The target material of the raw material used for forming the piezoelectric film 5 has preferably the same composition ratio as the composition ratio of the piezoelectric film 5. Preferably, the target material is fabricated by a hydrothermal synthesis method, with content of molecules controlled in a suitable amount, the molecules including organic molecules, molecules having a hydroxyl group, and molecules having a carbonyl group and an acyl group. Further, the target material with oxidation promoted and oxygen defect reduced as much as possible is preferable, by applying heat treatment thereto at 600° C. or more under atmospheric pressure of 1 to high pressure in oxygen, ozone, or $N_2O$ atmosphere. With this structure, the compositional deviation of oxygen can be suppressed during film formation by the sputtering method.

Subsequently, the upper electrode layer 6 is formed on the piezoelectric film 5. Note that the upper electrode layer 6 is formed similarly to the lower electrode layer 4.

Figure 2B:
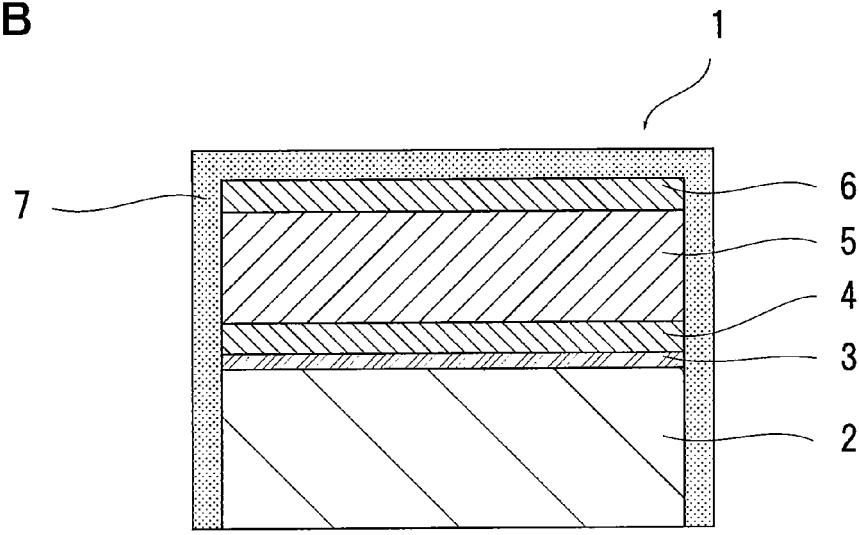
FIG. 2B is a cross-sectional view showing a structure of a piezoelectric film element according to other embodiment of the present invention.

Subsequently, as shown in FIG. 2B, the oxide thin film 7 is formed so as to coat the surface of the piezoelectric film 5. In this embodiment, a coating area of the oxide thin film 7 extends over the upper electrode layer 6, the piezoelectric film 5, the lower electrode layer 4, and the adhesion layer 3. The oxide thin film 7 is capable of protecting the piezoelectric film 5 from hydrogen or water, supplying oxygen to the piezoelectric film 5, and suppressing the reducing action in the vicinity of the interface between the body of the piezoelectric film 5 and the lower electrode layer 4. The oxide thin film 7 may be made of the same material as the material of the piezoelectric film 5, or may be a thin film of a single layer or a laminated layer composed of $SiO_x(0<x\leq2)$ or $AlO_x(0<x\leq1.5)$. For example, a $SiO_2$ film and an $Al_2O_3$ film, etc., can be used as the oxide thin film 7. The oxide thin film 7 is formed by a film forming method such as sputtering method, CVD method, sol-gel method, or a method of combination of at least any one of them. Note that the step of forming the oxide thin film 7 may be performed after the step of forming the upper electrode layer 6.

Subsequently, the piezoelectric film element 1 thus obtained is heated and oxidized at a temperature of 600° C. or more. By this heating process, $Nb^{2+}$ for NbO bonding having the oxygen defect in the piezoelectric film 5 is oxidized to $Nb^{5+}$. The oxidized $Nb^{5+}$ is selectively bonded to O-atom in the air or O-atom that exists in the atmosphere without bonding to Nb in the piezoelectric film, to thereby form $NbO_3^-$ bonding. As a result, in the piezoelectric film 5, the oxygen defect is reduced in the local structure of the atomic level, thus allowing the compositional deviation of oxygen to return. In the binding state around K-atom in the piezoelectric film 5, the K—O bonding ratio with respect to the total of K—O bonding and K-Metal bonding is 45% or more, with less oxygen defect. Accordingly, according to the method for manufacturing the piezoelectric film of this embodiment, even in a case of the piezoelectric film having the oxygen defect, the oxygen defect is complemented and the piezoelectric film having excellent piezoelectric characteristics can be formed. Further, high reproducibility of the piezoelectric film having excellent piezoelectric characteristics can be obtained and yield can be improved, because the oxygen defect in the piezoelectric film can be suitably adjusted by a heating process.

The temperature for heating and oxidizing the piezoelectric film element 1 is preferably set to 1420° C. or less. If such heating and oxidizing temperature exceeds 1420° C., damage added on Si crystal used for the substrate becomes great. Further, the compositional deviation is generated, due to mutual diffusion of elements between the interface and the piezoelectric film. Moreover, a crystal orientation of the piezoelectric film itself is destroyed, thus deteriorating the piezoelectric characteristics.

A heat treatment atmosphere in the heating process is not limited provided that the piezoelectric film can be oxidized, and the heat treatment can be performed in the air, in a vacuum state, or in an inert gas atmosphere, or in the atmosphere of any one of the gases of oxygen, ozone, and $N_2O$, being atmosphere gases for promoting oxidation, or a mixed gas atmosphere including one of such gases. Specifically, an environment in which oxygen concentration with respect to concentration of inert gas Ar and nitrogen $N_2$ is within a range of 15 to 25%, or an environment of 100% oxygen concentration and ozone concentration, can be considered. Particularly, the atmosphere of any one of the oxygen, ozone, and $N_2O$, being the gases for promoting oxidation, or the atmosphere of a mixed gas including one of them, is preferable. This is because oxidation is promoted in the heating and oxidizing process, and the oxygen defect can be suitably reduced. Preferably, the volume of the gas such as oxygen remained in a film formation chamber by sputtering and a water molecule including oxygen, is adjusted as needed before film formation, during film formation, or after film formation.

(A Piezoelectric Film Device)

Next, a piezoelectric film device using the piezoelectric film element according to this embodiment will be described.

Figure 3:
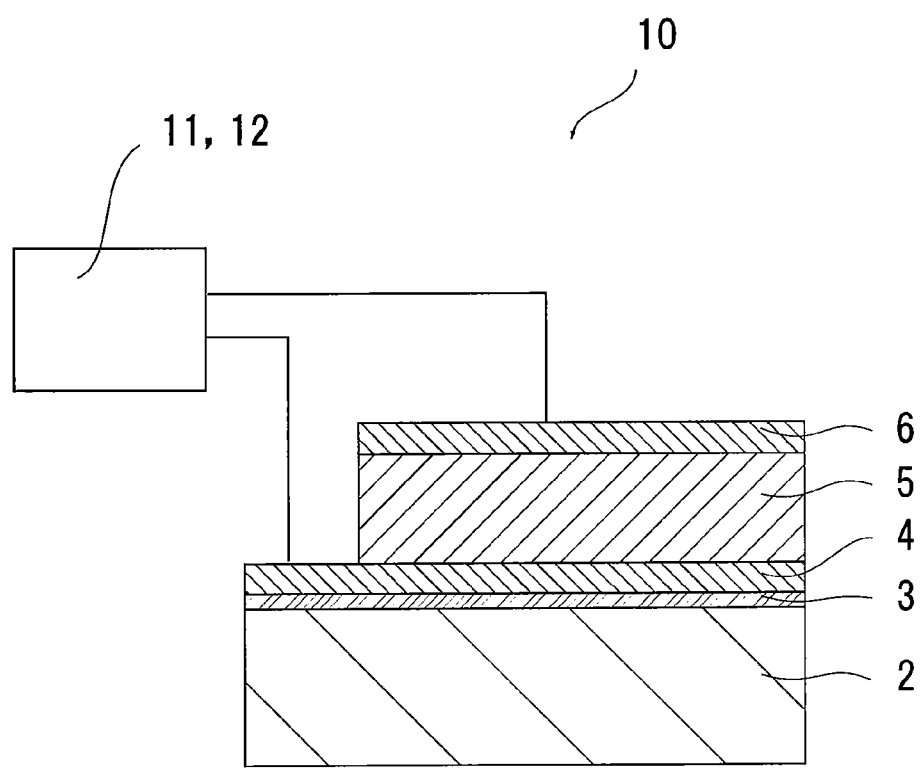
FIG. 3 is a cross-sectional view showing a structure of a piezoelectric film device according to an embodiment of the present invention.

As shown in FIG. 3, a sensor as a piezoelectric film device 10, can be obtained by molding the piezoelectric film element 1 of this embodiment into a prescribed shape, and connecting a voltage detecting unit 11 between the lower electrode layer 4 and the upper electrode layer 6. When the piezoelectric film element of this sensor is deformed by variation of some kind of a physical quantity, a prescribed voltage is generated by displacement of the deformation. Therefore, each kind of physical quantity can be measured by detecting the voltage by a voltage detector 11. For example, a gyro sensor, an ultrasonic sensor, a pressure sensor, and a speed/acceleration sensor, etc., can be given as the sensor.

Further, as shown in FIG. 3, an actuator as the piezoelectric film device 10 can be obtained by connecting a voltage application unit 12 between the lower electrode layer 4 and the upper electrode layer 6 of the piezoelectric film element 1 of this embodiment. Each kind of member can be operated by deforming the piezoelectric film element, by applied voltage to the piezoelectric film element of the actuator. For example, the actuator can be used in an inkjet printer, a scanner, and an ultrasonic wave generator, etc.

EXAMPLES

Next, the present invention will be specifically described, using examples.

First, a Si substrate was prepared as a substrate, and a thermal oxide film was formed on the surface of the Si substrate. Next, a Ti film (having a film thickness of 2 nm) was formed as an adhesion layer, on the thermal oxide film. Then, the lower electrode layer (having a film thickness of 200 nm) made of Pt was formed through the adhesion layer, using a metal target made of Pt, by a RF magnetron sputtering method. The lower electrode layer was formed under film forming conditions such as substrate temperature:350° C.; charging power of sputtering:100 W; atmosphere gas:100% Ar gas, $O_2$ mixed gas, or mixed gas mixing inert gas of at least one or more of He, Ne, Kr, and $N_2$; pressure:1 to 10 Pa; and film forming time:1 to 10 minutes.

Figure 11:
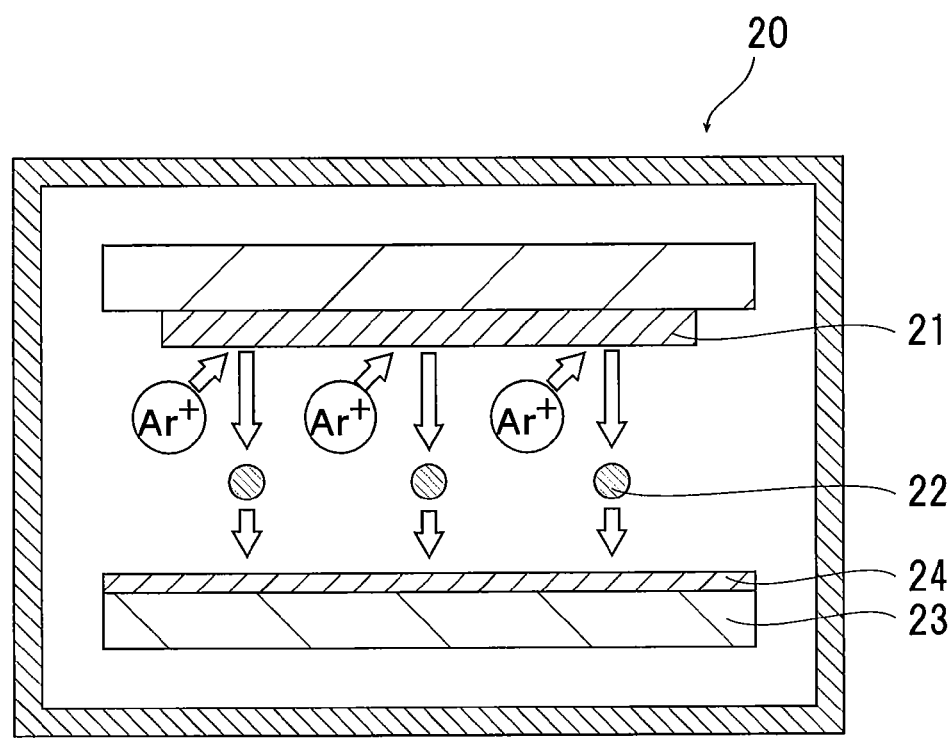
FIG. 11 is a schematic view of sputtering equipment for forming the piezoelectric film.

Next, a lithium potassium sodium niobate (called KNN hereafter) piezoelectric film (having a film thickness of 3 μm) was formed as a piezoelectric layer on the substrate on which the lower electrode layer was formed, using a RF magnetron sputtering system shown in FIG. 11. A ceramic target was used as a raw material target in this film formation, namely the ceramic target fabricated by a hydrothermal synthesis method not using C (carbon) was used, and the ceramic target expressed by $(Na_xK_yLi_z)NbO_3$ (x=0.5, y=0.5, z=0) was used, wherein contents of organic molecules, molecules having a hydroxyl group, and molecules having a carbonyl group and an acyl group are controlled in a suitable amount. Further, the ceramic target was subjected to heat treatment of 600° C. or more under atmospheric pressure of 1 to high pressure in oxygen, ozone, or $N_2O$ atmosphere, thereby promoting oxidation, and reducing the oxygen defect as much as possible.

The KNN piezoelectric film was formed under film forming conditions such as forming temperature:400 to 500° C.; charging power:0.03 w/mm$^2$; atmosphere gas:mixed gas of Ar and $O_2$ at a ratio of 5:5, or Ar gas, or mixed gas mixing inert gas of at least one or more of He, Ne, Kr, and $N_2$; pressure:0.7 Pa; and film forming time:1 hour.

Next, the Si substrate on which the piezoelectric film was formed, was subjected to heat treatment at a prescribed temperature, by using resistance heating as a heat source, in the atmosphere of oxygen or the inert gas or the mixed gas of them, in the air, or in the vacuum state. Conditions of the heat treatment was set as follows: air pressure:101.33 kPa (standard atmospheric pressure); atmosphere gas:inert gas Ar or mixed gas in which oxygen concentration with respect to nitrogen $N_2$ was set in a range of 15 to 25%; and heating temperature: 700° C.; temperature raising time up to 700° C.:1 hour or less; heat treatment holding time at 700° C.:2 hours; and temperature decreasing time down to a room temperature from 700° C.:3 hours or less.

Finally, the upper electrode layer made of Pt (having a film thickness of 20 nm) was formed on the piezoelectric film by sputtering, thus forming the piezoelectric film element according to an embodiment of the present invention.

Example 2

In example 2, the KNN piezoelectric film was formed under similar conditions as the conditions of example 1, excluding a point that the heating temperature of the piezoelectric film was set to 600° C.

Comparative Examples 1 to 4

Next, comparative examples will be described focusing on different points from the aforementioned examples. A different point in the comparative examples was only a temperature for heating the formed piezoelectric film, which was set to 500° C., 400° C., 300° C., and without heating, respectively, and the other conditions were similar to the conditions of the examples, and under these conditions, the KNN piezoelectric film was formed.

(Evaluation of the Piezoelectric Film)

Regarding the piezoelectric film obtained in the examples and the comparative examples, the crystal structure and the orientation, the composition ratio, the binding state of the atomic level, and the piezoelectric characteristics were evaluated.

(Evaluation of the Crystal Structure and the Orientation)

The crystal structure and the orientation of the KNN piezoelectric film obtained in the examples and the comparative examples were examined. First, when a cross-sectional shape of the KNN piezoelectric film obtained in the example 1 was observed, it was found that the KNN piezoelectric film had a columnar structure in cross section. The KNN piezoelectric film of comparative examples 1 to 4 had a similar columnar structure as the columnar structure of example 1, and there was no difference recognized in the structure.

Figure 4:
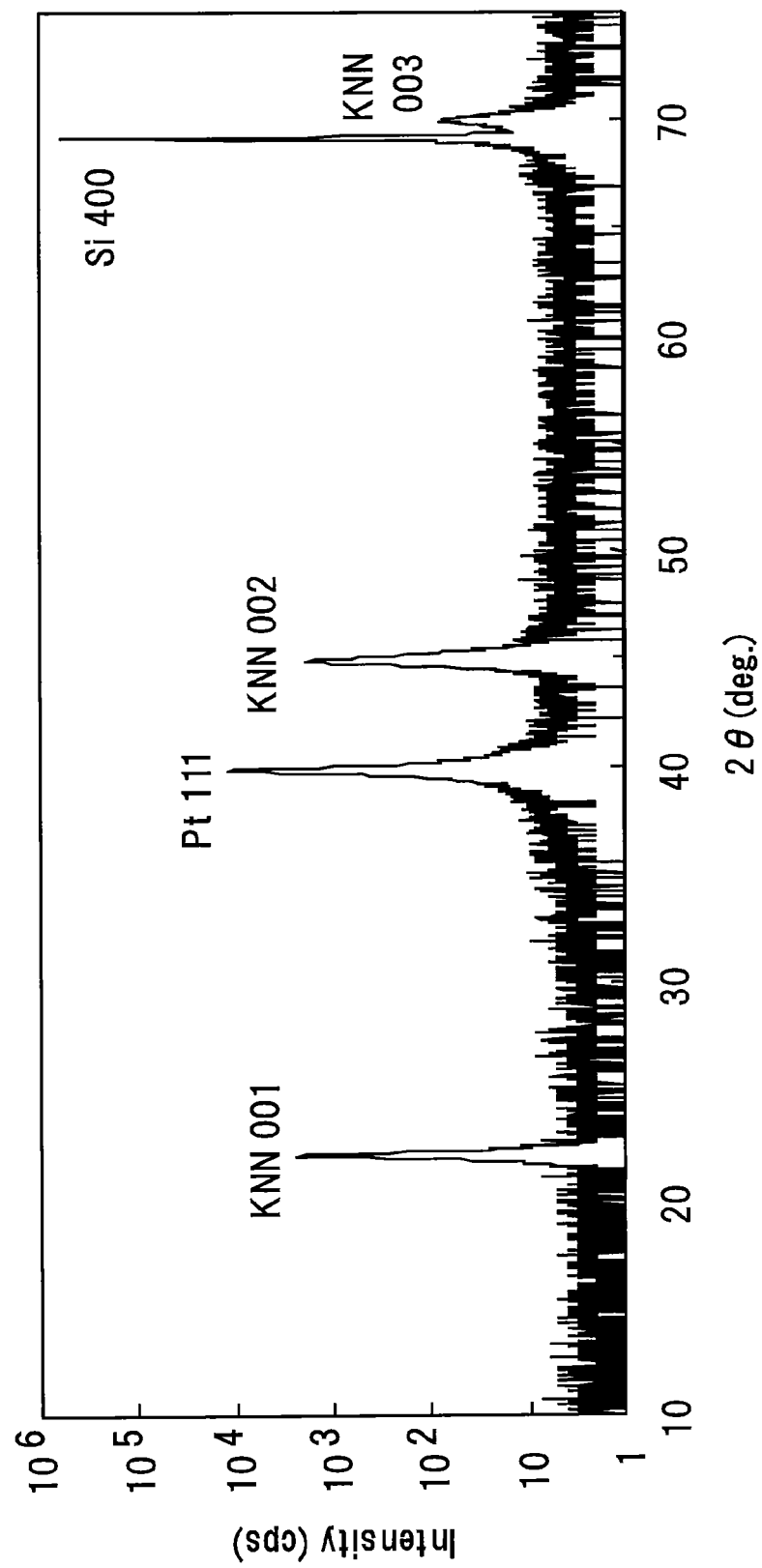
FIG. 4 is a view showing an X-ray diffraction pattern measured by 2θ/θ scan measurement in the piezoelectric film of example 1.

Next, the crystal structure of the KNN piezoelectric film of examples was examined by a general X-ray diffractometer. As a result, as shown in an X-ray diffraction pattern of FIG. 4 (2θ/θ scan measurement), it was confirmed that in the KNN piezoelectric film of example 1, a Pt layer, being the lower electrode layer formed by heating the substrate, was preferentially oriented in (111) plane in a vertical direction to the surface of the substrate. The KNN piezoelectric film formed on the Pt layer was a polycrystalline thin film having a perovskite crystal structure of a pseudo-cubic crystal with only diffraction peaks 001, 002, 003 confirmed. Therefore, it was confirmed that this KNN piezoelectric film was preferentially oriented in (001) plane direction. Meanwhile, in the KNN piezoelectric film of comparative example 4, only diffraction peaks of 001, 002, 003 could be measured, and therefore it was confirmed that this KNN piezoelectric film was preferentially oriented in (001) plane direction, similarly to example 1. A clear difference could not be confirmed between the example and the comparative example, from the evaluation of the crystal structure and the orientation.

(Evaluation of the Binding State of the Atomic Level)

Subsequently, the local structure of the atomic level of a specific atom of the KNN piezoelectric film obtained in the examples and the comparative examples, was evaluated by the XPS method. In the XPS method, AXIS-ULTRA (produced by KRATOS) was used as an analyzer.

Specifically, a sample of example 1 (10 mm×2.5 mm) was set in an ultrahigh vacuum state, and was irradiated with Al Kα X-ray (1487.6 eV) which is made monochromatic by a spectroscope. Kinetic energy of photoelectrons ejected from atoms excited by irradiation of X-rays was measured. A channel-tron multiplier or a micro channel plate, etc., being a general electron multiplier, was used for a measurement of the kinetic energy. Then, bonding (binding) energy of electrons in a specific atom was obtained by subtracting a work function and the kinetic energy of the measured photoelectrons from the incident X-ray energy. Further, the number of photoelectrons having a specific binding energy was measured, and the number of the binding state of a specific atom was expressed as intensity.

From the measured result, bonding energy (binding energy) of the electrons was taken on the horizontal axis, and the number of the detected photoelectrons was taken on the vertical axis, thus drawing a profile of an X-ray photoelectron spectrum of the specific atom.

In this example, in order to quantitatively evaluate the binding state of each atom constituting the KNN piezoelectric film, integrated intensity calculation of each spectrum component, for example, a component with different bonding state or a photoelectron spectrum with different valence number, was performed to the X-ray photoelectron optical profile of K2p, Na1s, Nb3d, and O1s, which are constituent atoms. K2p indicates a spectrum of 2p orbit of K-atom, and the spectrum of each electron orbit is shown similarly regarding other atom as well.

(Binding State of K-Atom)

Figure 5B:
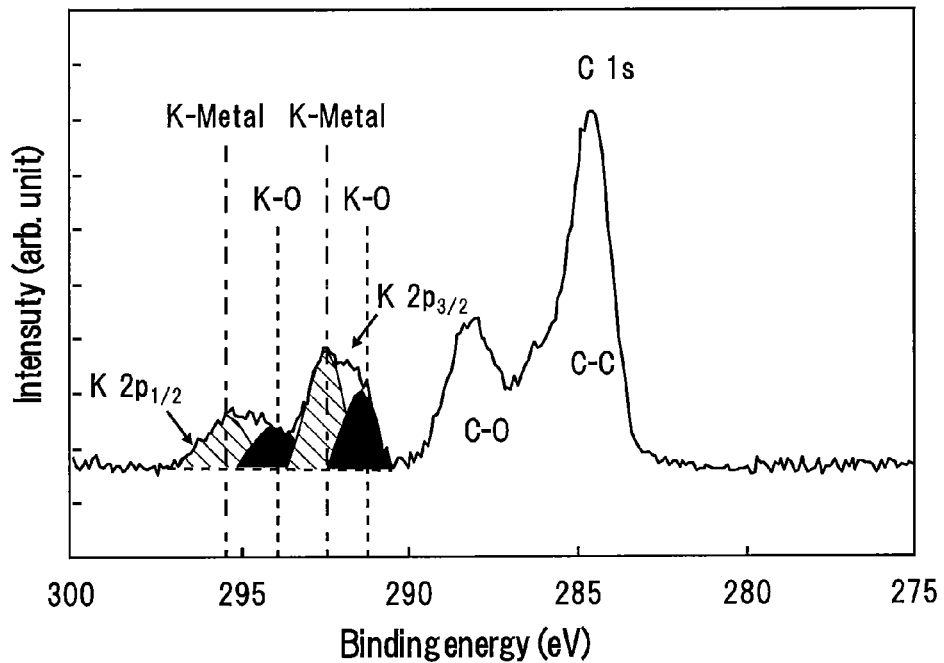
FIG. 5B is a view showing a spectrum of K2p obtained by measuring a piezoelectric film of comparative example 1 by X-ray photoelectron spectroscopic analysis.

In this example, K-atom was selected and measured as an atom of A-site. FIG. 5A shows a spectrum of K2p of X-ray photoelectron optical analysis measured for K-atom of the KNN piezoelectric film obtained in example 1, and FIG. 5B shows a spectrum obtained by comparative example 4. In FIG. 5A and FIG. 5B, the horizontal axis shows the binding energy of K2p, and the vertical axis shows the intensity of K2p.

A peak position of the detected spectrum was derived by fitting analysis of the aforementioned statistic distribution function and background correction. Further, the binding state around K-atom was found from a deconvolution of the profile. As a result, it was found that a shaded area of FIG. 5A and FIG. 5B showed the profile of K-atom in which K-Metal bonding (K—Nb bonding, K—Na bonding, K—K bonding) was formed, and the spectrum of a black area shows a profile of K-atom for K—O bonding. In the spectrum of K2p, the constituent element was divided into two energy levels of K2p3/2 and K2p1/2 by spin orbit interaction, so that the peak was detected.

As shown in FIG. 5B, it was found that in comparative example 4, the integrated intensity of the spectrum peak of K-atom for K-Metal bonding (shaded area in the figure) was larger than the integrated intensity of the spectrum peak of K-atom for K—O bonding (black area in the figure). Meanwhile, in example 1, as shown in FIG. 5A, the piezoelectric film was oxidized by heat treatment, and the integrated intensity of K-atom for K—O bonding was large. It is found from this fact, that O-atoms are increased by heat treatment in example 1.

Next, the integrated intensity of K—O bonding and K-Metal bonding obtained from the aforementioned spectrum, was obtained by spectrum fitting analysis using the statistic distribution function such as Gauss function and Lorentz function, and Pseudo voight function which is a convolution function of them, Pearson function, and Split Pseudo Voight function. Further, a straight line method, a Shiley method, or a Tougaard method were used for the background correction of the spectrum. Moreover, quantitative analysis was performed to an element composition, in consideration of a relative sensitivity coefficient and matrix correction in each element.

Then, in the KNN piezoelectric film obtained in example 1 and comparative example 4, the K—O bonding ratio with respect to the total of K—O bonding and K-Metal bonding was calculated from the integrated intensity of K-atom for K—O bonding, and the integrated intensity of K-atom for K-Metal bonding. As a result, in example 1, the K—O bonding ratio was 51.4%, which was larger than 34.7% of comparative example 4. In comparative example 4, there is less O-atoms that were coordinated and bonded to K-atom, because of the compositional deviation caused by the oxygen defect. Meanwhile, example 1 shows that O-atom in the air or O-atom that exists independently of the K-atom in the piezoelectric film is selectively bonded to K-atom by heating and oxidizing process, resulting in promoting an increase of the number of K—O bonding. Further, table 1 shows analysis values of the K—O bonding ratio in other examples, based on the convolution method. According to table 1, it is found that oxidation of the piezoelectric film is promoted by rise of the heating temperature, thus relatively increasing the K—O bonding ratio.

In FIG. 5A and FIG. 5B, the peak of the spectrum in the vicinity of the binding energy of 285 eV is C1s, thereby showing impurities adhered to the surface of the sample. Usually, the binding energy of the peak value is used as a criterion of energy correction.

TABLE 1

|  | Example 1 | Example 2 | Comparative example 1 | Comparative example 2 | Comparative example 3 | Comparative example 4 |
| --- | --- | --- | --- | --- | --- | --- |
| Heat treatment temperature(° C.) | 700 | 600 | 500 | 400 | 300 | without heating |
| K—O(%) | 51.4 | 48.9 | 46.4 | 43.9 | 41.5 | 34.7 |
| K-Metal(%) | 48.6 | 51.1 | 53.6 | 56.1 | 58.5 | 65.3 |
| Piezoelectric constant(pm/V) | 94.8 | 80.8 | 66.9 | 53.1 | 39.2 | 1.4 |
| tan δ | 0.33 | 0.32 | 0.34 | 39.8 | 138 | 138 |

(Binding State of Nb-Atom)

Figure 6A:
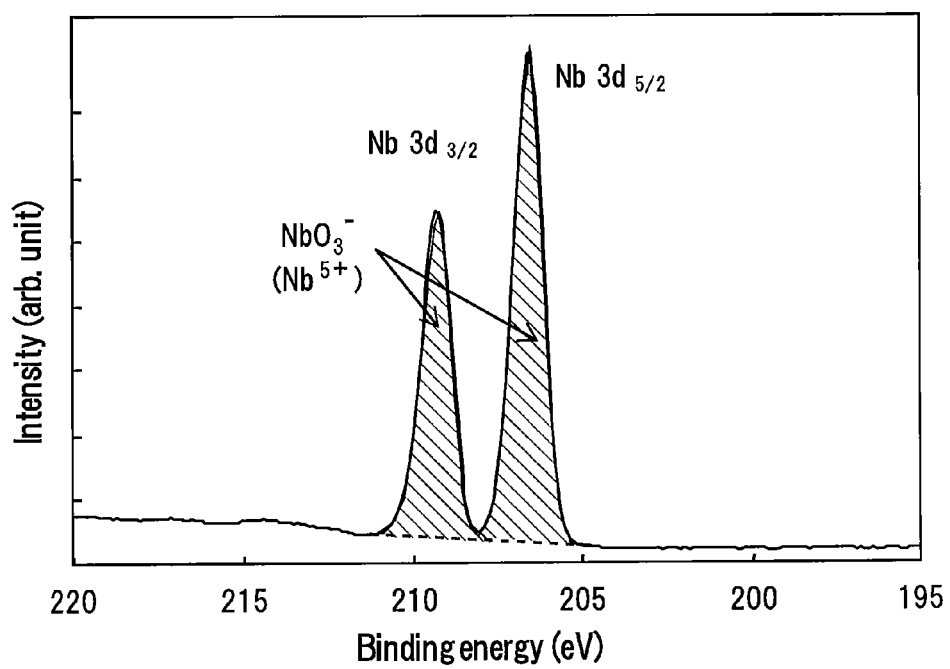
FIG. 6A is a view showing a spectrum of Nb3d obtained by measuring the piezoelectric film of example 1 by X-ray photoelectron spectroscopic analysis.
Figure 6B:
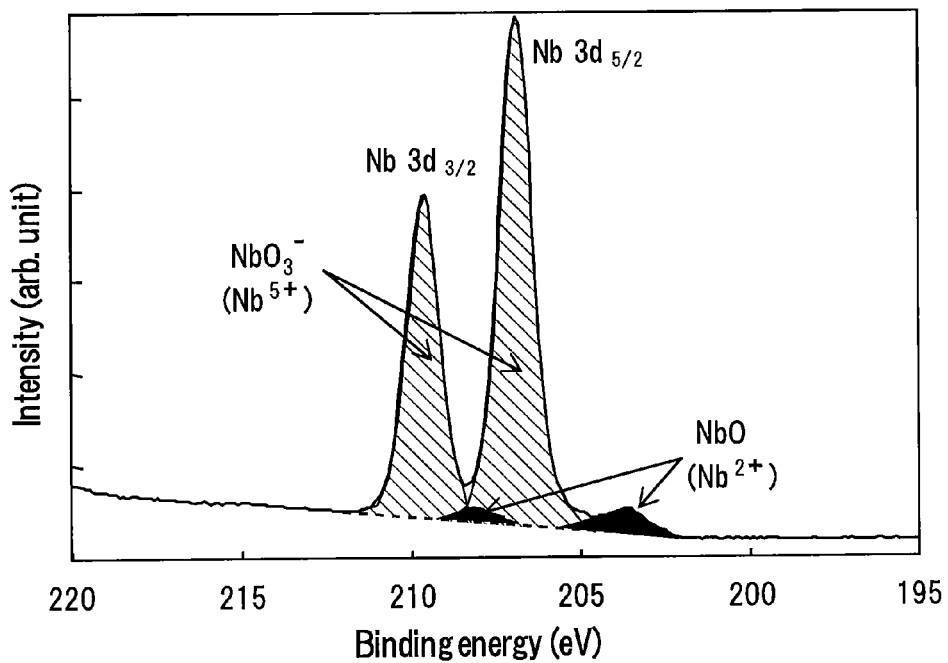
FIG. 6B is a view showing a spectrum of Nb3d obtained by measuring the piezoelectric film of comparative example 1 by X-ray photoelectron spectroscopic analysis.

Further, similarly to the XPS measurement of K-atom of the piezoelectric film as described above, the spectrum of Nb3d was measured for Nb-atom of the piezoelectric film obtained in the example. A measurement result of example 1 is shown in FIG. 6A, and a measurement result of comparative example 4 is shown in FIG. 6B. In FIG. 6A and FIG. 6B, the local structure around Nb-atom is analyzed, wherein the spectrum in the shaded area in the figure shows a profile derived from $Nb^{5+}$ for $NbO_3^-$ bonding, and the spectrum in the black area shows a profile derived from $Nb^{2+}$ for NbO bonding. Note that similarly to the K-atom, Nb3d is divided into two energy levels in Nb-atom and the peak is detected.

According to FIG. 6B, it is found that in the piezoelectric film of comparative example 4, $Nb^{5+}$ and $Nb^{2+}$ coexist in the crystal structure, thus having the oxygen defect. Meanwhile, according to FIG. 6A, it is found that in the piezoelectric film of example 1, the spectrum of Nb3d of $Nb^{2+}$ for NbO bonding disappears, and only the spectrum of $Nb^{5+}$ having high valence number for $NbO_3^-$ bonding is measured. This shows that the piezoelectric film of example 1 does not have the oxygen defect, and does not include $Nb^{2+}$. A reason for the disappearance of $Nb^{2+}$ is considered that $Nb^{2+}$ in the piezoelectric film is oxidized to $Nb^{5+}$, and O-atom is selectively bonded to Nb-atom, thus reducing the oxygen defect. The change of the ratio of $Nb^{2+}$ by heating coincides with the change of the aforementioned spectrum of XPS of K2p.

Further, the ratio of $Nb^{5+}$ and $Nb^{2+}$ was calculated from the integrated intensity of the spectrum. In example 1, the ratio of $Nb^{5+}$ is 100%. Meanwhile, in comparative example 4, the ratio of $Nb^{5+}$ is 93.8%, and the ratio of $Nb^{2+}$ is 6.2%. Table 2 shows the other results of the example. According to table 2, it is found that the ratio of $Nb^{2+}$ that exists in the piezoelectric film is reduced with increase of the heating temperature of the piezoelectric body, thus reducing the oxygen defect.

cess. Namely, the ratio of the O-atom for $NbO_3^-$ bonding ($Nb^{5+}$) is relatively increased by the heating process. From this result, it can be considered that the ratio of $Nb^{2-}$ is reduced, and the ratio of $Nb^{5+}$ is increased by the heating process, regarding the Nb-atom bonding around the O-atom. Further, it can be considered that the O-atom for $K_2O$ bonding and $Na_2O$ bonding is reduced by the heating process. Note that such a change by the heating process coincides with the change of the XPS spectrum of Nb3d as described above.

TABLE 2

|  | Example 1 | Example 2 | Comparative example 1 | Comparative example 2 | Comparative example 3 | Comparative example 4 |
| --- | --- | --- | --- | --- | --- | --- |
| Heat treatment temperature(° C.) | 700 | 600 | 500 | 400 | 300 | without heating |
| $Nb^{2+}$(%) | 0.0 | 1.0 | 1.9 | 2.9 | 3.9 | 6.8 |
| $Nb^{5+}$(%) | 100.0 | 99.0 | 98.1 | 97.1 | 96.1 | 93.2 |
| Piezoelectric constant(pm/V) | 94.8 | 81.7 | 68.5 | 55.2 | 41.9 | 1.4 |
| tan δ | 0.33 | 0.32 | 0.34 | 39.8 | 138 | 138 |

(Binding State of O-Atom)

Figure 7A:
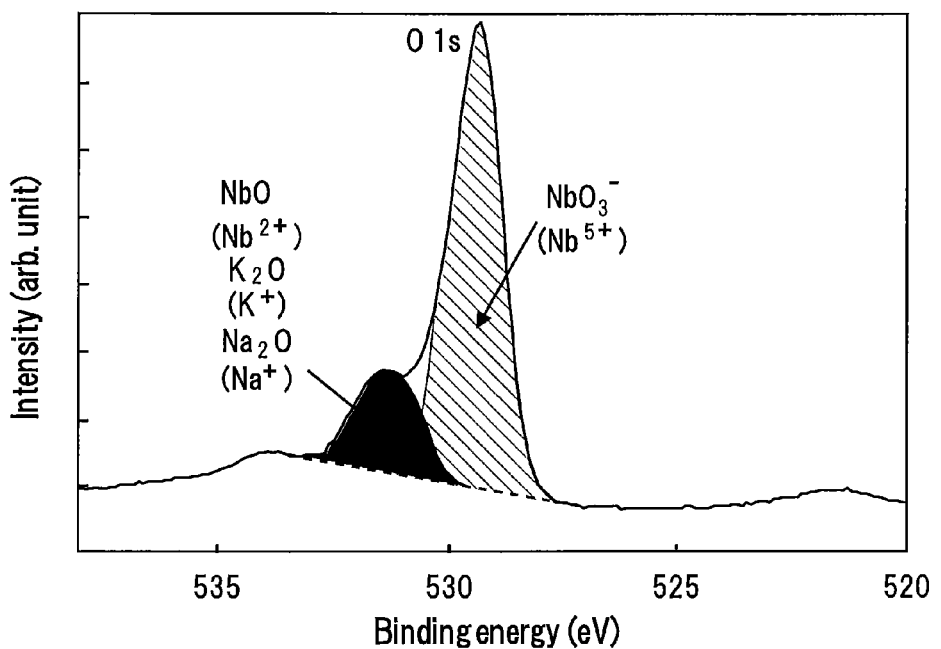
FIG. 7A is a view showing a spectrum of O1s obtained by measuring the piezoelectric film of example 1 by X-ray photoelectron spectroscopic analysis.
Figure 7B:
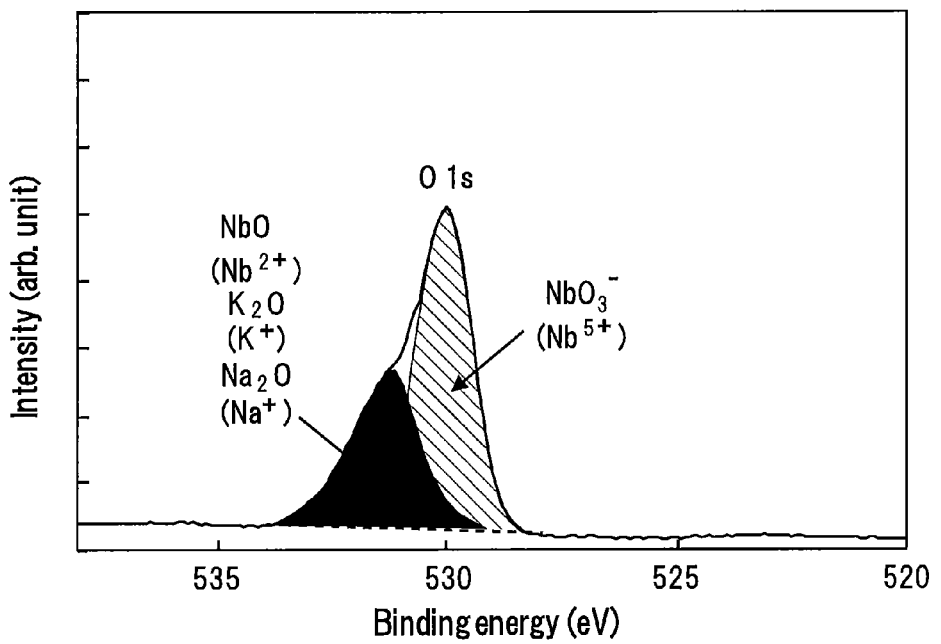
FIG. 7B is a view showing a spectrum of O1s obtained by measuring the piezoelectric film of comparative example 1 by X-ray photoelectron spectroscopic analysis.

Subsequently, similarly to the XPS measurement of the binding state of the K-atom and the Nb-atom of the piezoelectric film, the spectrum of O1s was measured for the O-atom of the piezoelectric film obtained in the example. A measurement result of example 1 is shown in FIG. 7A, and a measurement result of comparative example is shown in FIG. 7B. In FIG. 7A and FIG. 7B, the horizontal axis shows the binding energy with O1s as a center, and the vertical axis shows the intensity of the binding energy. In FIG. 7A and FIG. 7B, the spectrum of a low energy side shaded area, being the right side of 530 eV shows a profile derived from O-atom for $NbO_3^-$ bonding. Meanwhile, the spectrum of a high energy side black area, being the left side of 530 eV shows a profile derived from O-atom for NbO bonding, and O-atom for $K_2O$ bonding and $Na_2O$ bonding. O-atom for $NbO_3^-$ bonding shows the O-atom bonding to $Nb^{5+}$. Further, O-atom for NbO bonding shows the O-atom bonding to $Nb^{2+}$. Similarly, O-atom for $K_2O$ bonding and $Na_2O$ bonding shows the O-atom bonding to $K^+$, and the O-atom bonding to $Na^+$ respectively.

When FIG. 7A and FIG. 7B are compared, it is found that the integrated intensity of the spectrum peak of the O-atom for $NbO_3^-$ bonding is increased by the heating process. Further, it is found that the integrated intensity of the spectrum peak of the O-atom for NbO bonding and the O-atom for $K_2O$ bonding and $Na_2O$ bonding, is reduced by the heating pro- Further, from the integrated intensity of the spectrum, the ratio of O-atom for $NbO_3^-$ bonding, and the ratio of O-atom for NbO bonding, $K_2O$ bonding, and $Na_2O$ bonding, were respectively calculated. In example 1, the ratio of O-atom bonding to $Nb^{5+}$ is 65.1%, and the ratio of O-atom bonding to $Nb^{2+}$, $K^+$, and $Na^+$ is 34.9%. Meanwhile, in comparative example 4, the ratio of O-atom bonding to $Nb^{5+}$ is 52.3%, and the ratio of O-atom bonding to $Nb^{2+}$, $K^+$, and $Na^+$ is 47.7%. Results of other examples are shown in table 3. According to table 3, similarly to table 1 and table 2, it is found that the oxygen defect is reduced by the heating process.

TABLE 3

|  | Example 1 | Example 2 | Comparative example 1 | Comparative example 2 | Comparative example 3 | Comparative example 4 |
| --- | --- | --- | --- | --- | --- | --- |
| Heat treatment temperature(° C.) | 700 | 600 | 500 | 400 | 300 | without heating |
| $Nb^{2+}$, $K^+$, $Na^+$ (%) | 34.9 | 36.8 | 38.7 | 40.6 | 42.5 | 47.7 |
| $Nb^{5+}$(%) | 65.1 | 63.2 | 61.3 | 59.4 | 57.5 | 52.3 |
| Piezoelectric constant(pm/V) | 94.8 | 80.8 | 66.9 | 53.1 | 39.2 | 1.4 |
| tan δ | 0.33 | 0.32 | 0.34 | 39.8 | 138 | 138 |

(Evaluation of the Piezoelectric Characteristics)

Subsequently, the piezoelectric characteristics of the piezoelectric film obtained in examples and comparative examples were measured. As a measurement method, a strip-shaped simple unimorph cantilever with a width of 2.5 mm and a length of 20 mm was prepared and a displacement of a tip part of the cantilever at the time of applying a unipolar sine wave voltage thereto, was measured by a laser Doppler displacement meter.

Figure 8:
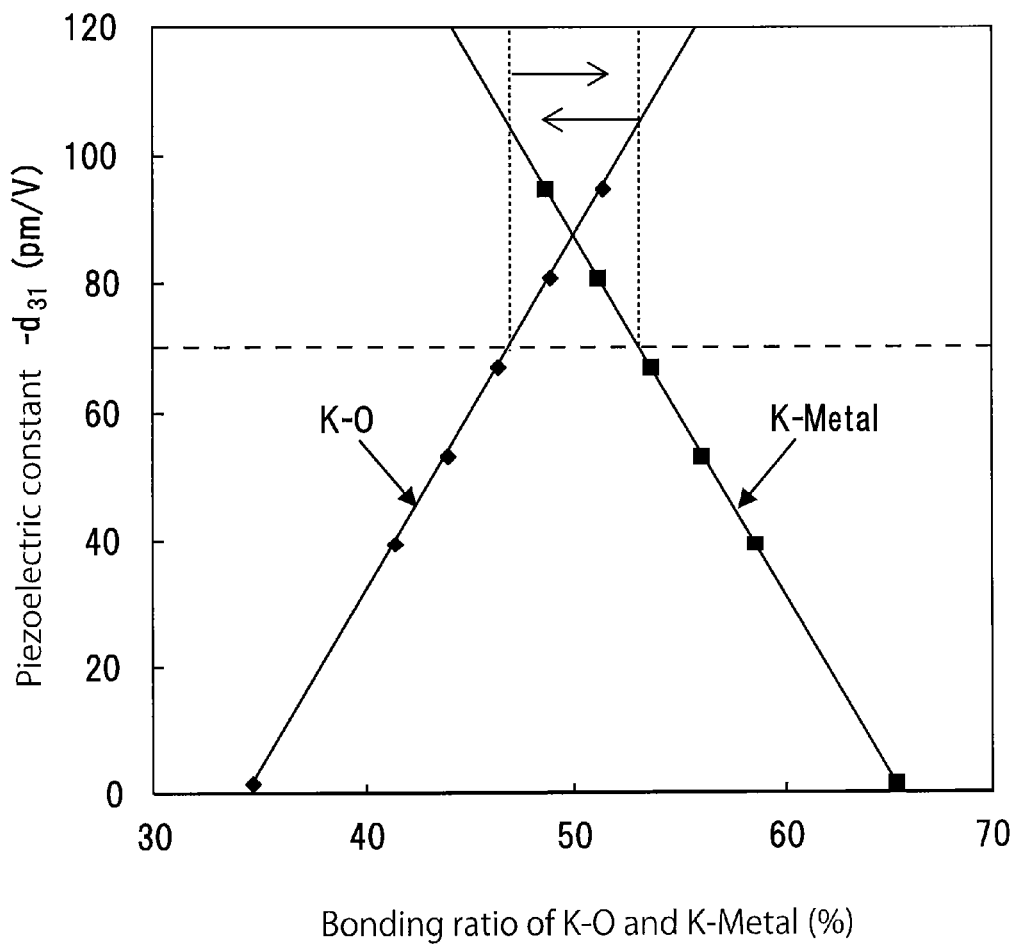
FIG. 8 is a view showing a correlation between a piezoelectric constant and a K—O bonding ratio or a K-Metal bonding ratio in a binding state around K-atom of the piezoelectric film.

When piezoelectric constants $-d_{31}$ of example 1 and comparative example 4 are compared, example 1 shows 94.8 [pm/V] while comparative example 4 shows 1.4 [pm/V], thus showing excellent piezoelectric characteristics in example 1. The piezoelectric characteristics of the piezoelectric film of the other examples and comparative examples are shown in table 1. Further, FIG. 8 shows a correlation between the piezoelectric constant, and K—O bonding ratio or K-Metal bonding ratio in the binding state around K-atom of the piezoelectric film. In FIG. 8, the horizontal axis shows K—O bonding ratio or K-Metal bonding ratio, and the vertical axis shows the piezoelectric constant. Note that in FIG. 8, lozenge plots show the K—O bonding ratio, and square plots show the K-Metal bonding ratio, respectively. Further, total of the lozenge plots and square plots arranged in a horizontal direction is 100%.

As shown in table 1, it is found that the K—O bonding ratio in the piezoelectric film is gradually increased by raising the temperature for heating the piezoelectric film, and the number of O-atoms included in the crystal structure is also increased. Further, according to FIG. 8, it is found that the K-Metal bonding ratio is relatively reduced, with an increase of the K—O bonding ratio, and when the K—O bonding ratio reaches 46.5% or more, the piezoelectric constant becomes a prescribed value (70 [pm/V]) or more. Further according to table 1, it is found that dielectric loss (tan δ) can be reduced to 0.4 or less by setting the K—O bonding ratio at 46.5% or more. Moreover, it is found that the number of O-atoms can be increased by setting the K—O bonding ratio at 45% or more when the heating temperature is set at 600° C. or more.

Figure 9:
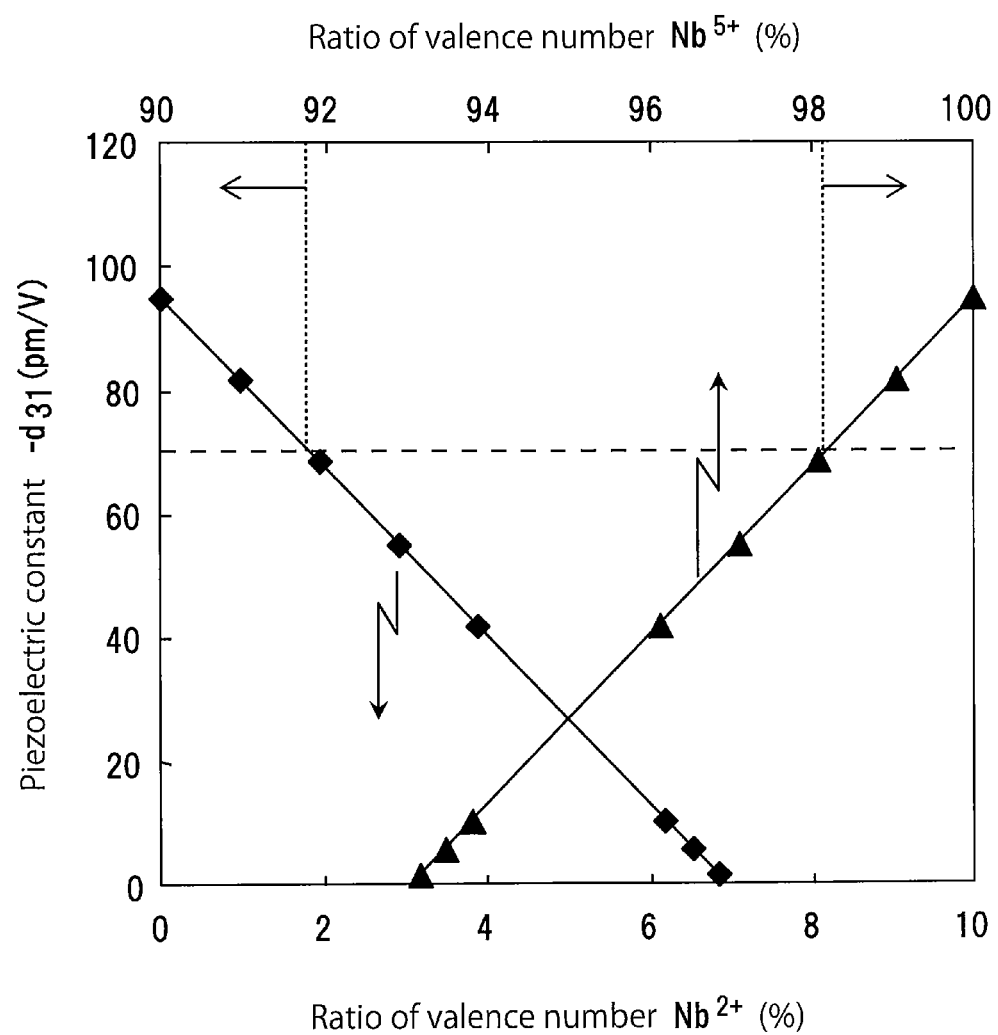
FIG. 9 is a view showing a correlation between the piezoelectric constant and a ratio of $Nb^{5+}$ or $Nb^{2+}$ in a binding state around Nb-atom of the piezoelectric film.

Subsequently, FIG. 9 shows a correlation between the piezoelectric constant, and the ratio of $Nb^{5+}$ or $Nb^{2+}$ in the binding state around Nb-atom of the piezoelectric film. In FIG. 9, the horizontal axis shows the ratio of $Nb^{5+}$ or $Nb^{2+}$ and the vertical axis shows the piezoelectric constant. Note that in FIG. 9, triangle plots show the ratio of $Nb^{5+}$, and lozenge plots show the ratio of $Nb^{2+}$ respectively. Further, total of the triangle plots and the lozenge plots arranged in the horizontal direction is 100%.

According to FIG. 9, the piezoelectric constant is increased, as the ratio of $Nb^{5+}$ is increased and the ratio of $Nb^{2+}$ is decreased. The piezoelectric constant can be set to 70 [pm/V] or more by setting the ratio of $Nb^{5+}$ to 98.2% or more and setting the ratio of $Nb^{2+}$ to 1.8% or less. In addition, as shown in table 2, the dielectric loss (tan δ) can be reduced to 0.4 or less. Namely, the atomic level structure of the piezoelectric film is controlled and the piezoelectric characteristics can be improved, by oxidizing Nb-atom and increasing the number of O-atoms coordinated and bonding around the Nb-atom.

Figure 10:
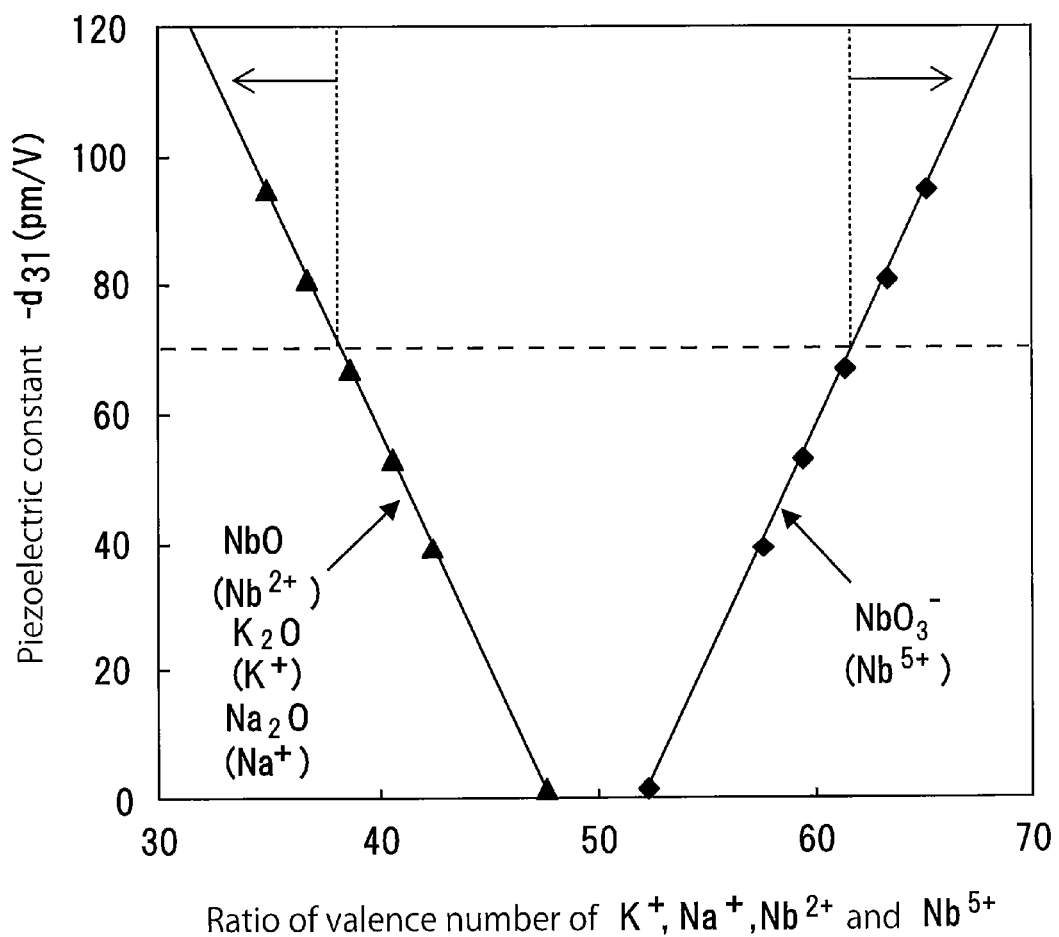
FIG. 10 is a view showing a correlation between the piezoelectric constant and a ratio of $Nb^{5+}$ or ratios of Nb2+, K+, and Na+, in a binding state around O-atom of the piezoelectric film.

Subsequently, FIG. 10 shows a correlation between the piezoelectric constant, and the ratio of $Nb^{5+}$ or the ratios of $Nb^{2+}$, $K^+$, and $Na^+$, in the bonding state around the O-atom of the piezoelectric film. In FIG. 10, the horizontal axis shows the ratio of $Nb^{5+}$, or the ratio of $Nb^{2+}$, $K^+$, and $Na^+$, and the vertical axis shows the piezoelectric constant. Note that in FIG. 10, lozenge plots show the ratio of $Nb^{5+}$, and triangle plots show the ratio of $Nb^{2+}$, $K^+$, and $Na^+$. Further, total of the triangle plots and the lozenge plots is 100%.

According to FIG. 10, it is found that the piezoelectric constant is increased, as the ratios of $Nb^{2+}$, $K^+$, and $Na^+$ are decreased, and the ratio of $Nb^{5+}$ is increased. The result coincides with the increase of the piezoelectric constant which is increased with the increase of $Nb^{5+}$ obtained by the analysis of the binding state around Nb-atom shown in FIG. 9. The piezoelectric constant can be set to 70 [pm/V] or more by setting the ratio of $Nb^{5+}$ to 61.4% or more and setting the ratios of $Nb^{2+}$, $K^+$, and $Na^+$ to 38.6% or less. In addition, as shown in table 3, the dielectric loss (tan δ) can be reduced to 0.4 or less.

Thus, it is found that the piezoelectric film of the present invention has excellent piezoelectric characteristics with less oxygen defect, because atomic level control is performed to the atom constituting the piezoelectric film, in the local structure around A-site atom.

In addition, according to the aforementioned example, the KNN piezoelectric film including K and Na is used for explanation. However, the present invention is not limited thereto.

Li, Na, and K belong to a first group and are homologous elements, and therefore are atoms having same valence number. Therefore, these elements can be easily substituted with A-site atoms having an $ABO_3$ structure, being the perovskite structure of the present invention, and the piezoelectric film having the piezoelectric characteristics with the same performance as the performance of KNN, can be obtained.

What is claimed is:

1. A piezoelectric film having an alkali niobate-based perovskite structure expressed by a general formula $(Na_xK_yLi_z)NbO_3$ ($0 \leq x \leq 1$, $0 \leq y \leq 1$, $0 \leq z \leq 0.2$, $x+y+z=1$), wherein the alkali niobate has a crystal structure of a pseudo-cubic crystal, a tetragonal crystal, an orthorhombic crystal, a monoclinic crystal, a rhombohedral crystal, or has a crystal structure of coexistence of them, and when total of K—O bonding and K-Metal bonding is set as 100% in a binding state around K-atom of the alkali niobate, a K—O bonding ratio is 46.5% or more and a K-Metal bonding ratio is 53.5% or less, wherein the Metal indicates a metal atom included in the piezoelectric film.

2. The piezoelectric film according to claim 1, wherein the alkali niobate is included so that the ratio of $Nb^{5+}$ is 98.2% or more and the ratio of $Nb^{2+}$ is 1.8% or less, when total of $Nb^{5+}$ for $NbO_3^-$ bonding and $Nb^{2+}$ for NbO bonding resulting from reducting $NbO_3^-$, is set as 100%.

3. The piezoelectric film according to claim 1, wherein the alkali niobate is included so that the ratio of $Nb^{5+}$ is 61.4% or more and total of the ratios of $Nb^{2+}$, $K^+$, $Na^+$, and $Li^+$ is 38.6% or less, when total of $Nb^{5+}$ for $NbO_3^-$ bonding, $Nb^{2+}$ for NbO bonding resulting from reducting $NbO_3^-$, $K^+$ for $K_2O$ bonding, $Na^+$ for $Na_2O$ bonding, and $Li^+$ for $Li_2O$ bonding, is set as 100%.

4. The piezoelectric film according to claim 1, wherein the K—O bonding ratio is calculated as the ratio of intensity of the K—O bonding, with respect to total of intensity of the K—O bonding and intensity of the K-Metal bonding, measured by an X-ray photoelectron spectroscopic analysis.

5. The piezoelectric film according to claim 1, wherein any one of a crystal layer, an amorphous layer, or a mixed layer mixing the crystal layer and the amorphous layer made of perovskite oxide expressed by a general formula $ABO_3$, is included in a part of the alkali niobate, wherein in the $ABO_3$, the A—O bonding ratio is 46.5% or more and the A-Metal bonding ratio is 53.5% or less when total of the A—O bonding and the A-Metal bonding is set as 100% in a binding state around A-atom, wherein A is one kind or more elements selected from Li, Na, K, Pb, La, Sr, Nd, Ba, and Bi, and B is one kind or more elements selected from Zr, Ti, Mn, Mg, Nb, Sn, Sb, Ta, and In, and O is oxygen.

6. The piezoelectric film according to claim 5, wherein in the $ABO_3$, the ratio of $B^{5+}$ is 98.2% or more and the ratio of $B^{2+}$ is 1.8% or less, when total of $B^{5+}$ for $BO_3^-$ bonding and $B^{2+}$ for BO bonding resulting from reducting $BO_3^-$ is set as 100% in a binding state around B-atom.

7. The piezoelectric film according to claim 5, wherein in the $ABO_3$, the ratio of $B^{5+}$ is 61.4% or more and total ratios of $B^{2+}$ and $A^+$ is 38.6% or less, when total of $B^{5+}$ for $BO_3^-$ bonding and $B^{2+}$ for BO bonding resulting from reducting $BO_3^-$, and $A^+$ for $A_2O$ bonding is set as 100% in a binding state around B-atom.

8. A piezoelectric film, comprising at least a lower electrode layer, the piezoelectric film of claim 1, and an upper electrode layer on a substrate.

9. The piezoelectric film according to claim 8, wherein the upper electrode layer and/or the lower electrode layer is a single electrode layer made of Pt or an alloy mainly composed of Pt, or an electrode layer of a lamination structure including the electrode layer mainly composed of Pt.

10. The piezoelectric film according to claim 8, wherein the upper electrode layer and/or the lower electrode layer is a single electrode layer made of Pd or an alloy mainly composed of Pd, or an electrode layer of a lamination structure including the electrode layer mainly composed of Pd.

11. The piezoelectric film according to claim 8, comprising an oxide thin film for coating the piezoelectric film.

12. A piezoelectric film device, comprising a voltage application unit or a voltage detection unit between the lower electrode layer and the upper electrode layer of the piezoelectric film element of claim 8.

* * * * *